US012765136B2

(12) United States Patent
Park et al.

(10) Patent No.: US 12,765,136 B2
(45) Date of Patent: Oct. 13, 2026

(54) LIGHT EMITTING DEVICE INCLUDING MOLDING AND DISPLAY APPARATUS HAVING THE LIGHT EMITTING DEVICE

(71) Applicant: SEOUL VIOSYS CO., LTD., Ansan-si (KR)

(72) Inventors: Jae Hyun Park, Ansan-si (KR); Mi So Ko, Ansan-si (KR); Eun Mi Choi, Ansan-si (KR); Seung Sik Hong, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 692 days.

(21) Appl. No.: 18/116,846

(22) Filed: Mar. 3, 2023

(65) Prior Publication Data

US 2023/0282787 A1 Sep. 7, 2023

Related U.S. Application Data

(60) Provisional application No. 63/415,996, filed on Oct. 14, 2022, provisional application No. 63/317,063, filed on Mar. 6, 2022.

(51) Int. Cl.

| | |
|---|---|
| ***H10H 20/854*** | (2025.01) |
| ***H10H 20/855*** | (2025.01) |
| ***H10W 90/00*** | (2026.01) |

(52) U.S. Cl.

CPC ........ *H10H 20/854* (2025.01); *H10H 20/855* (2025.01); *H10W 90/00* (2026.01)

(58) Field of Classification Search

CPC . H01L 25/0753; H10H 20/854; H10H 20/882

(Continued)

(56) References Cited

U.S. PATENT DOCUMENTS

2008/0180611 A1* 7/2008 Minato .................. G02B 5/201 252/582
2019/0371974 A1* 12/2019 Hussell ................. H10W 90/00

(Continued)

FOREIGN PATENT DOCUMENTS

EP 2 472 578 A2 7/2012
KR 20-0363141 Y1 9/2004

(Continued)

OTHER PUBLICATIONS

International Search Report in PCT Application No. PCT/KR2023/003048 dated Jun. 1, 2023 (with English Concise Explanation).

(Continued)

*Primary Examiner* — Ratisha Mehta
*Assistant Examiner* — Mikka Liu
(74) *Attorney, Agent, or Firm* — Oblon, McClelland, Maier & Neustadt, L.L.P.

(57) ABSTRACT

A light emitting device including a plurality of light emitting diodes configured to emit light, a substrate electrically connected to the plurality of light emitting diodes, and a molding covering at least one surface of the plurality of light emitting diodes, in which the plurality of light emitting diodes includes a first light emitting diode configured to emit red light, a second light emitting diode configured to emit green light, and a third light emitting diode configured to emit blue light, and the molding includes one or more of a plurality of different color pigments and a plurality of different color dyes.

19 Claims, 32 Drawing Sheets

(58) Field of Classification Search
USPC .............................................. 257/88–89, 100
See application file for complete search history.

(56) References Cited

U.S. PATENT DOCUMENTS

| | | | | |
|---|---|---|---|---|
| 2020/0105974 | A1* | 4/2020 | Ozeki | H10H 20/84 |
| 2020/0161514 | A1 | 5/2020 | Hwang et al. | |
| 2021/0399041 | A1 | 12/2021 | Park et al. | |
| 2022/0069167 | A1* | 3/2022 | Lee | H10H 20/8312 |
| 2022/0204695 | A1* | 6/2022 | Kumazawa | C08F 2/50 |
| 2023/0029597 | A1* | 2/2023 | Kim | H10H 20/8512 |
| 2023/0163264 | A1* | 5/2023 | Li | H01L 25/0753 257/91 |

FOREIGN PATENT DOCUMENTS

| | | | |
|---|---|---|---|
| KR | 10-2006-0117612 | A | 11/2006 |
| KR | 10-2015-0090783 | A | 8/2015 |
| KR | 10-2016-0144726 | A | 12/2016 |
| KR | 10-2020-0021399 | | 2/2020 |
| WO | 2021-256787 | A1 | 12/2021 |

OTHER PUBLICATIONS

Extended European Search Report mailed Dec. 12, 2025, in European Application No. 23767108.6-1211.

* cited by examiner

A – A'

LIGHT EMITTING DEVICE INCLUDING MOLDING AND DISPLAY APPARATUS HAVING THE LIGHT EMITTING DEVICE

CROSS REFERENCE TO RELATED APPLICATION

This application claims priority from and the benefit of United States Provisional Patent Application No. 63/415,996, filed on Oct. 14, 2022, and United States Provisional Patent Application No. 63/317,063, filed on Mar. 6, 2022, each of which is hereby incorporated by reference for all purposes as if fully set forth herein.

BACKGROUND

Field

Exemplary embodiments of the invention relate generally to a light emitting device and a display apparatus.

Discussion of the Background

In general, a light emitting diode (LED) is a semiconductor light emitting device in which electrons and holes meet to emit light when a current is applied. The light emitting diode may emit light, and is used in a backlight light source, a display element, a lighting device, etc. of a display apparatus.

The above information disclosed in this Background section is only for understanding of the background of the inventive concepts, and, therefore, it may contain information that does not constitute prior art.

SUMMARY

Light emitting modules and a display apparatus having the same according to exemplary embodiments of the invention are capable of mitigating a color difference according to a viewing angle of a display module and minimizing a luminance loss.

Exemplary embodiments also provide a light emitting module and a display apparatus having an improved structure to minimize dark and bright lines of the display module.

Exemplary embodiments further provide a light emitting module and a display apparatus capable of precisely emitting red light, green light, and blue light of a display module at a desired luminance ratio.

Additional features of the inventive concepts will be set forth in the description which follows, and in part will be apparent from the description, or may be learned by practice of the inventive concepts.

In accordance with an aspect of the present disclosure, there may be provided a light emitting device, including: a plurality of light emitting diodes configured to emit light; a substrate electrically connected to the plurality of light emitting diodes; and a molding that covers at least one surface of the plurality of light emitting diodes, wherein the plurality of light emitting diodes includes a first light emitting diode for emitting red light, a second light emitting diode for emitting green light, and a third light emitting diode for emitting blue light, and wherein the molding includes one or more of a plurality of different color pigments and a plurality of different color dyes.

Further, there may be provided the light emitting device wherein the molding satisfies one of the following three ranges in LAB color coordinate system.

First range: $-3 \leq a' \leq 3$, $-10 \leq b' \leq 0$

Second range: $-5 \leq a' \leq 5$, $-8 \leq b' \leq 2$

Third range: $-4 \leq a' \leq 4$, $-4 \leq b' \leq 4$

Further, there may be provided the light emitting device wherein the molding further includes a polymer resin and a curing initiator.

Further, there may be provided the light emitting device wherein the molding includes an upper molding and a lower molding.

Further, there may be provided the light emitting device wherein the upper molding is formed of a plurality of layers, and at least one of the upper molding is a transparent layer.

Further, there may be provided the light emitting device wherein the molding further include a diffusion agent.

Further, there may be provided the light emitting device wherein light emitted from at least one of the plurality of light emitting diodes and transmitted through the molding has a color difference ($\Delta u'v'$) of 0.01 or less when viewed at an angle of 45 degrees from one side or the other side, in a horizontal or vertical direction, with respect to when viewed from a front side.

Further, there may be provided the light emitting device wherein light emitted from at least one of the plurality of light emitting diodes and transmitted through the molding has a color difference ($\Delta u'v'$) of 0.03 or less when viewed at an angle of 80 degrees from one side or the other side, in a horizontal or vertical direction, with respect to when viewed from a front side.

Further, there may be provided the light emitting device wherein light emitted from at least one of the plurality of light emitting diodes and transmitted through the molding has an average color difference ($\Delta u'v'$) of 0.003 or less in a range of adjacent angle ranges and a height difference of 0.005 or less between waveforms of adjacent ranges in a range of −80 degrees to +80 degrees, in a horizontal or vertical direction, with respect to when viewed from a front side.

Further, there may be provided a light emitting device including: a plurality of light emitting diodes configured to emit light; a substrate electrically connected to the plurality of light emitting diodes; and a molding that covers at least one surface of the plurality of light emitting diodes, wherein the plurality of light emitting diodes includes a first light emitting diode for emitting red light, a second light emitting diode for emitting green light, and a third light emitting diode for emitting blue light, and wherein the molding includes at least one diffusion agent.

Further, there may be provided the light emitting device wherein light emitted from at least one of the plurality of light emitting diodes and transmitted through the molding has a color difference ($\Delta u'v'$) of 0.01 or less when viewed at an angle of 45 degrees from one side or the other side, in a horizontal or a vertical direction, with respect to when viewed from a front side.

Further, there may be provided the light emitting device wherein light emitted from at least one of the plurality of light emitting diodes and transmitted through the molding has a color difference ($\Delta u'v'$) of 0.03 or less when viewed at an angle of 80 degrees from one side or the other side, in a horizontal or a vertical direction, with respect to when viewed from a front side.

Further, there may be provided the light emitting device wherein light emitted from at least one of the plurality of light emitting diodes and transmitted through the molding has an average color difference ($\Delta u'v'$) of 0.003 or less in a range of adjacent angle ranges and a height difference of 0.005 or less between waveforms of adjacent ranges in a range of −80 degrees to +80 degrees, in a horizontal or vertical direction, with respect to when viewed from a front side.

Further, there may be provided the light emitting device wherein the diffusion agent is included in a molding part in an amount of 5 wt % to 20 wt % of the molding.

Further, there may be provided the light emitting device wherein a thickness of the molding is twice or more and 3 times or less a thickness of the light emitting diode.

Further, there may be provided the light emitting device wherein the molding includes one or more of a plurality of different color pigments and a plurality of different color dyes, and wherein the molding satisfies one of the following three ranges in LAB color coordinate system.

First range: $-3 \leq a' \leq 3$, $-10 \leq b' \leq 0$

Second range: $-5 \leq a' \leq 5$, $-8 \leq b' \leq 2$

Third range: $-4 \leq a' \leq 4$, $-4 \leq b' \leq 4$

Further, there may be provided a display apparatus including: a plurality of light emitting diodes configured to emit light; a substrate electrically connected to the plurality of light emitting diodes; and a molding that covers at least one surface of the plurality of light emitting diodes, wherein the plurality of light emitting diodes includes a first light emitting diode for emitting red light, a second light emitting diode for emitting green light, and a third light emitting diode for emitting blue light, and wherein the molding includes one or more of a plurality of different color pigments and a plurality of different color dyes.

Further, there may be provided the display apparatus wherein the molding satisfies one of the following three ranges in LAB color coordinate system.

First range: $-3 \leq a' \leq 3$, $-10 \leq b' \leq 0$

Second range: $-5 \leq a' \leq 5$, $-8 \leq b' \leq 2$

Third range: $-4 \leq a' \leq 4$, $-4 \leq b' \leq 4$

Further, there may be provided the display apparatus wherein the molding further include a diffusion agent.

Further, there may be provided the display apparatus wherein light emitted from at least one of the plurality of light emitting diodes and transmitted through the molding has a color difference ($\Delta u'v'$) of 0.03 or less when viewed at an angle of 80 degrees from one side or the other side, in a horizontal or vertical direction, with respect to when viewed from a front side.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
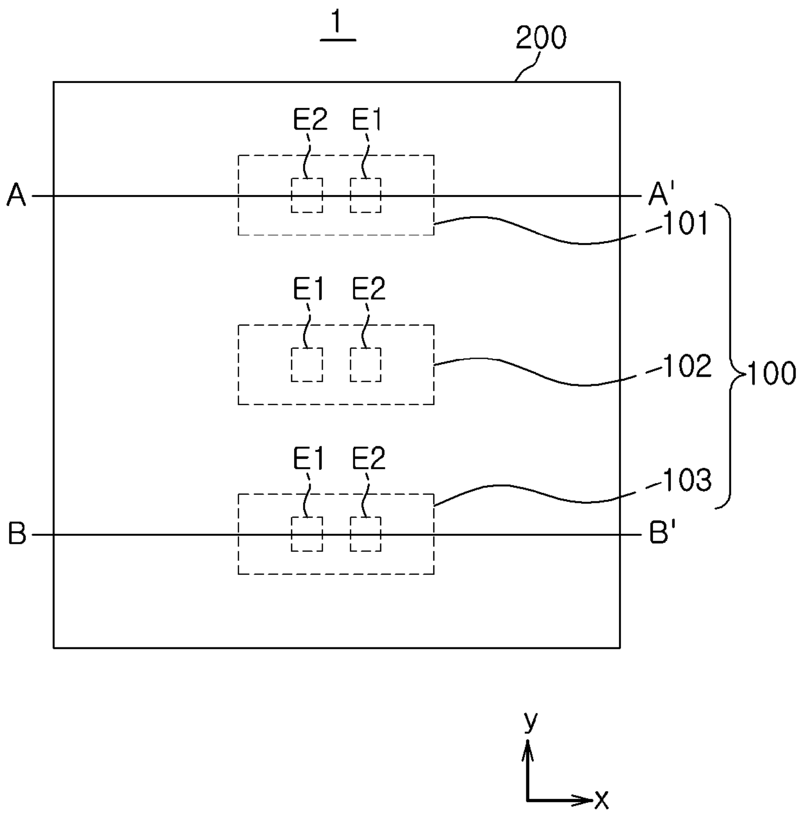
FIG. 1 is a plan view schematically illustrating a light emitting device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
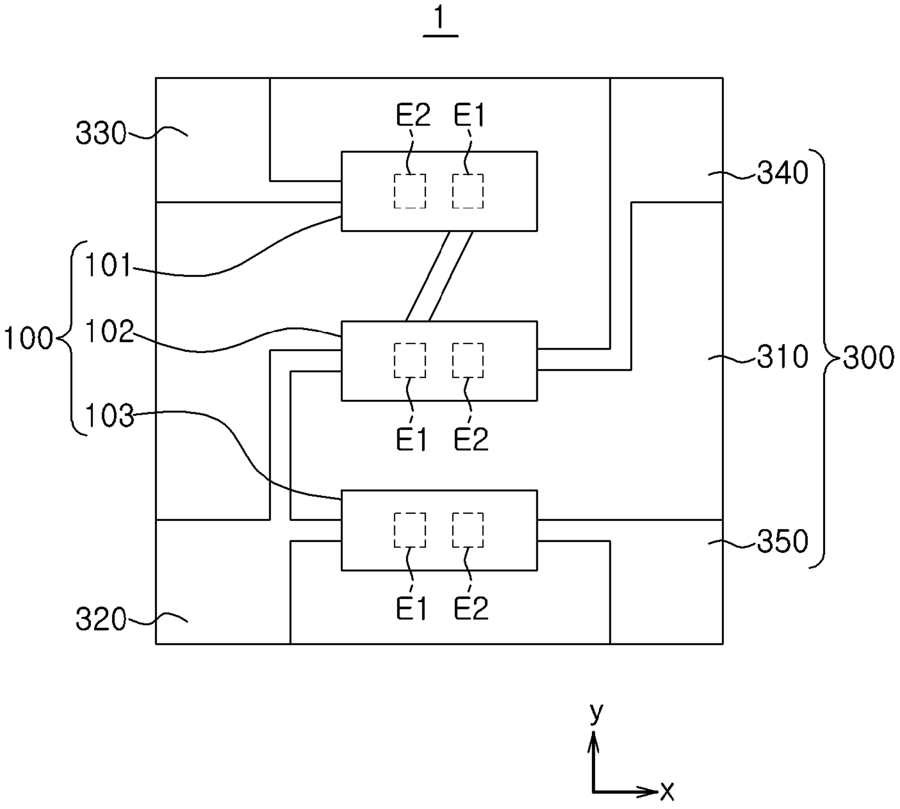
FIG. 2 is a plan view of the light emitting device in which a molding part is omitted from the light emitting device of FIG. 1.
Figure 3:
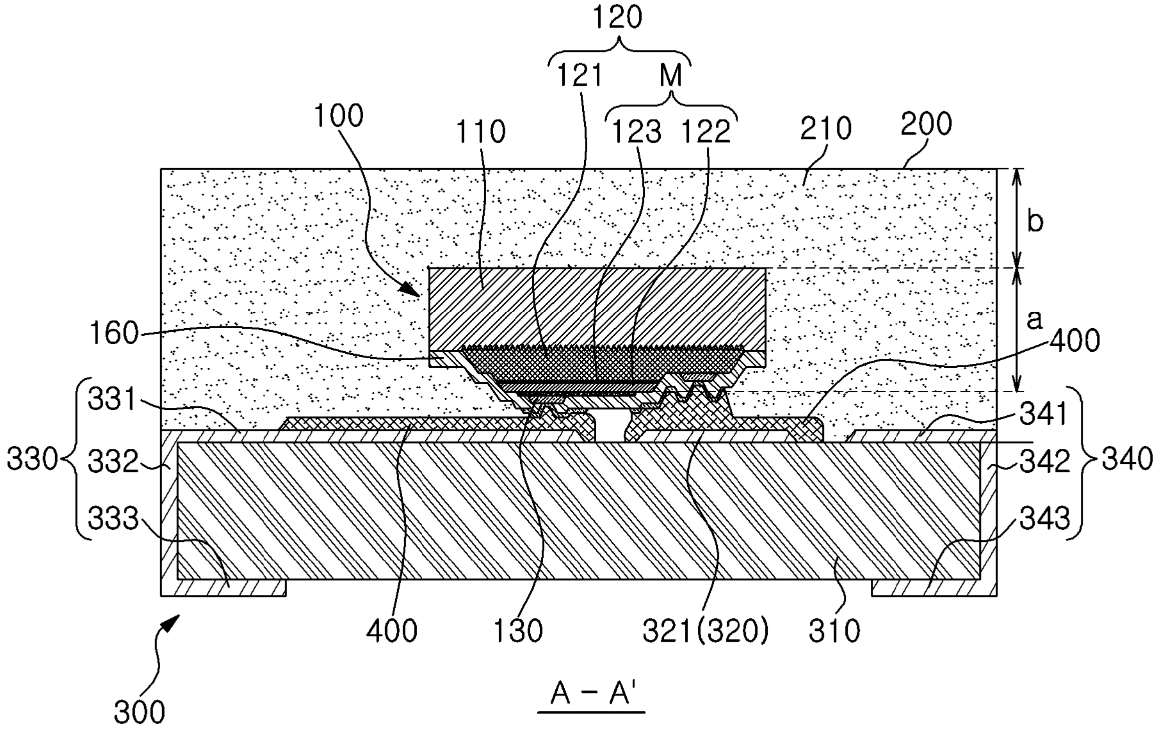
FIG. 3 is a cross-sectional view of the light emitting device taken along line A-A' of FIG. 1.

Referring to FIGS. 1 to 3, the light emitting device 1 according to a first exemplary embodiment may receive power from the outside and irradiate light. The light emitting device 1 may include a light emitting diode 100, a molding part 200, a substrate 300, and a conductive material 400.

The light emitting diode 100 may generate light. For example, the light emitting diode 100 may emit light having a peak wavelength in an ultraviolet wavelength band, a visible wavelength band, and/or an infrared wavelength band. In addition, the light emitting diode 100 may have a quadrangular shape having four corners when viewed from the top. Alternatively, the light emitting diode 100 may have a rectangular shape having a major axis and a minor axis, and in this case, the minor axis may have a relatively small horizontal cross-sectional area as compared with the major axis. For example, when the light emitting diode 100 is rectangular, the length of the major axis of the light emitting diode 100 may be less than twice the length of the minor axis. However, the light emitting diode 100 is not limited thereto and may have various shapes. A length of the major axis of the light emitting diode 100 may be 100 μm to 300 μm, a length of the minor axis may be 50 μm to 150 μm, and a height of the light emitting diode 100 may be 100 μm to 300 μm. However, the size of the light emitting diode 100 is not limited thereto, and the length of the major axis and the minor axis may be 50 μm or less. The light emitting diode 100 may be provided in plural, and the plurality of light emitting diodes 100 may include a first light emitting diode 101, a second light emitting diode 102, and a third light emitting diode 103. The plurality of light emitting diodes 100 may emit light of the same color gamut. The light emitted from the plurality of light emitting diodes 100 with the same color gamut may have different center wavelengths. At least one of the plurality of light emitting diodes 100 may emit light having a different color gamut. The first light emitting diode 101, the second light emitting diode 102, and the third light emitting diode 103 may emit light of different colors.

The plurality of light emitting diodes 100 may have a substantially same cross-sectional area when viewed from above. Further, at least one of the plurality of light emitting diodes 100 may have a different cross-sectional area when viewed from above. In particular, the area of the light emitting diode 100 emitting a long wavelength may be different from other light emitting diodes 100. Accordingly, a ratio of light emission intensity of light emitted from the plurality of light emitting diodes 100 may be easily adjusted.

The first light emitting diode 101 may emit red light, for example, and may emit light in a wavelength band of 600 nm to 780 nm. In addition, the second light emitting diode 102 may emit green light, for example, and may emit light in a wavelength band of 492 nm to 577 nm. In addition, the third light emitting diode 103 may emit blue light, for example, and may irradiate light in a wavelength band of 430 nm to 492 nm. The first light emitting diode 101, the second light emitting diode 102, and the third light emitting diode 103 may emit light of different wavelength ranges, and may simultaneously or individually emit light. According to an exemplary embodiment, the first light emitting diode 101, the second light emitting diode 102, and the third light emitting diode 103 may respectively emit lights of different peak wavelengths, and may simultaneously or individually emit lights.

The first light emitting diode 101, the second light emitting diode 102, and the third light emitting diode 103 may emit light having different brightness or light emission intensity. In addition, the luminance ratio of the first light emitting diode 101, the second light emitting diode 102, and the third light emitting diode 103 may be adjusted. The luminance ratio of the first light emitting diode 101, the second light emitting diode 102, and the third light emitting diode 103 may be 2-4:5-7:1. For example, the luminance ratio may be expressed as a:b:c, in which "a" is in the range of 2.5 to 3.5, "b" is in the range of 5.5 to 6.5, and "c" is in the range of 0.5 to 1.5. Through the above luminance ratio or light emission intensity ratio, even if light having a plurality of wavelengths is emitted, it is possible to prevent the respective wavelengths from affecting each other to deteriorate visibility, thereby increasing the visibility. For example, the luminance ratio of the first light emitting diode 101, the second light emitting diode 102, and the third light emitting diode 103 may be about 3:6:1, without being limited thereto.

In addition, the first light emitting diode 101, the second light emitting diode 102, and the third light emitting diode 103 may respectively emit light having different color coordinate values Cx and Cy. As used herein, the color coordinate values Cx and Cy refer to standard coordinate values according to "CIE 1391". For example, the first light emitting diode 101 may emit light having an x-color coordinate Cx in a range of 0.5 to 0.75 and a y-color coordinate Cy in a range of 0.15 to 0.35. In addition, the second light emitting diode 102 may emit light having an x-color coordinate Cx in a range of 0.01 to 0.34 and a y-color coordinate Cy in a range of 0.4 to 0.83. In addition, the third light emitting diode 103 may emit light having an x-color coordinate Cx in a range of 0.05 to 0.25 and a y-color coordinate Cy in a range of 0.01 to 0.5.

The first light emitting diode 101, the second light emitting diode 102, and the third light emitting diode 103 may have different driving voltages Vf when a same current flows. As used herein, the driving voltage Vf refers to a voltage for driving the light emitting diode 100, and may be a value measured when a current of 1 mA flows. The driving voltage Vf of each of the first light emitting diode 101, the second light emitting diode 102, and the third light emitting diode 103 may be increased as the wavelength of the emitted light is decreased. For example, the driving voltage Vf of the first light emitting diode 101 may be 1.8V to 2.1V, the driving voltage Vf of the second light emitting diode 102 may be 2.1V to 2.6V, and the driving voltage Vf of the third light emitting diode 103 may be 2.6V to 2.9V. Further, in the first light emitting diode 101, the second light emitting diode 102, and the third light emitting diode 103, the difference between the driving voltage Vf of the diode that emits light having the longest wavelength and the driving voltage Vf of the diode that emits light having the shortest wavelength may be less than 1V. For example, the difference between the driving voltage Vf of the first light emitting diode 101 emitting the light having the longest wavelength and the driving voltage Vf of the third light emitting diode 103 emitting the light having the shortest wavelength may be less than 1V. By designing the difference in the driving voltages Vf between the plurality of light emitting diodes 100 to be less than 1V, it is possible to prevent electric and heat concentration from being generated in a specific light emitting diode when the same current is supplied, thereby providing stable driving.

The light emitting device 1 may include a first surface parallel to a major axis of the at least one of the light emitting diodes 101, 102, and 103 and a second surface perpendicular to the first surface, and a length of the first surface of the light emitting device 1 may be in a range of two to seven times a length of the major axis of the at least one of the light emitting diodes 101, 102, and 103. Alternatively, the length of the first surface of the light emitting device 1 may be greater than the sum of the lengths of the minor axes of the plurality of LEDs 101, 102, and 103, and may be five times or less than the sum of the lengths of the minor axes of the plurality of LEDs 101, 102, and 103. Still alternatively, the length of the second surface of the light emitting device 1 may be two to seven times the length of the major axis of the LEDs 101, 102, and 103. The length of the second surface of the light emitting device 1 may be greater than the sum of the lengths of the minor axes of the plurality of LEDs 101, 102, and 103 and may be five times or less than the sum of the lengths of the minor axes of the plurality of LEDs 101, 102, and 103. Since the length of the light emitting device 1 has at least one of the above-described length relationships based on the light emitting diodes, when a plurality of light emitting devices 1 are arranged in rows and columns on the circuit board, a minimum distance between the central portions of the respective light emitting devices 1 may be regularly arranged based on the length of the first surface or the second surface, thereby implementing a module in which color deviation is minimized.

Figure 4:
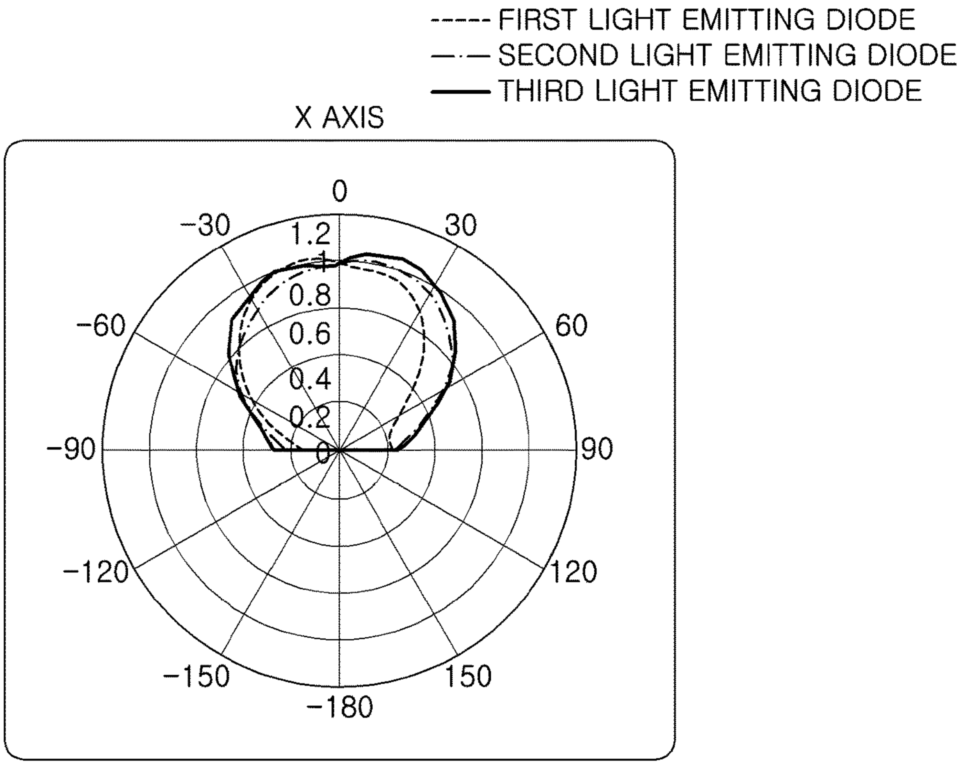
FIG. 4 is a graph showing an x-axis beam angle of first to third light emitting diodes of FIG. 1.
Figure 5:
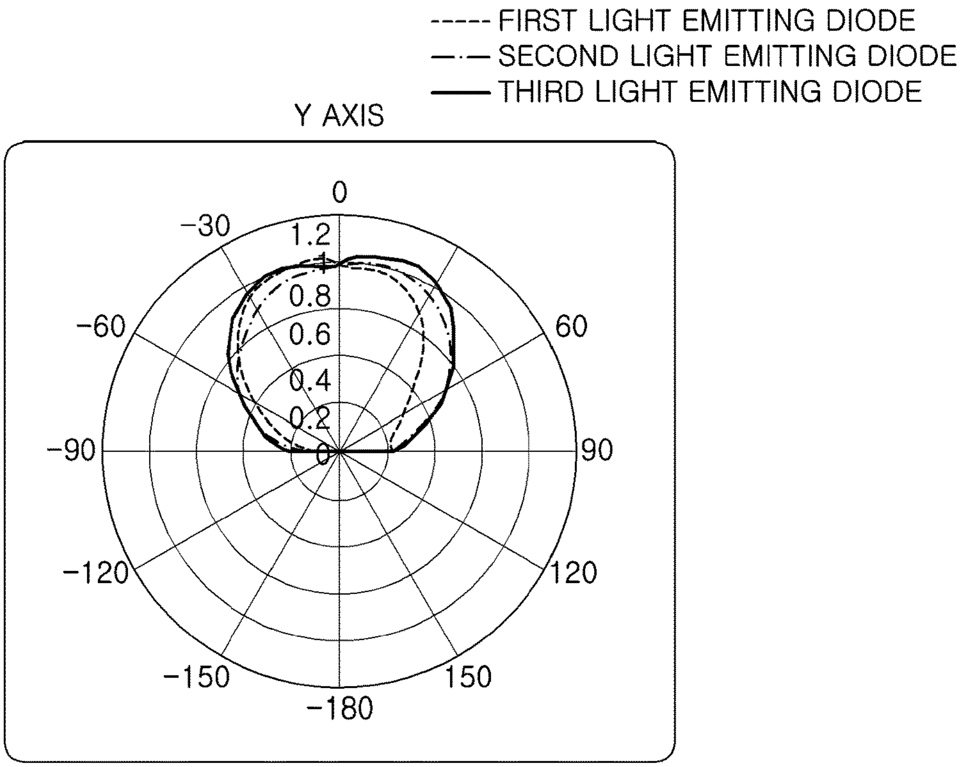
FIG. 5 is a graph showing a y-axis beam angle of the first to third light emitting diodes of FIG. 1.

Referring to FIGS. 4 and 5, the first light emitting diode 101, the second light emitting diode 102, and the third light emitting diode 103 may have different beam angles or directivity patterns. As used herein, a beam angle refers to a light emission angle at which a light intensity of 50% or more of the maximum light intensity is shown in light emitted from one light emitting diode. For example, a beam angle may refer an angle that is twice an angle between a first point at which the intensity of light emitted from the light emitting diode 100 is the highest and a second point at which the intensity of light is 50% of the intensity at the first point. In the first light emitting diode 101, the second light emitting diode 102, and the third light emitting diode 103, the x-axis beam angle may be smaller than the y-axis beam angle. As used herein, the x-axis beam angle is a value when an angle is measured based on the x-axis, and the y-axis beam angle is a value when an angle is measured based on the y-axis. For example, the first light emitting diode 101 may have an x-axis beam angle of 105° to 115° and a y-axis beam angle of 110° to 120°. In addition, the second light emitting diode 102 may have an x-axis beam angle of 120° to 140° and a y-axis beam angle of 135° to 145°. In addition, the x-axis beam angle of the third light emitting diode 103 may be 120° to 140°, and the y-axis beam angle may be formed within a range of 135° to 145°. This is to effectively implement color in consideration of the light emission efficiency of each of the light emitting diodes 101, 102, and 103.

In another exemplary embodiment, the difference between the x-axis beam angle and the y-axis beam angle of each light emitting diode in the first light emitting diode 101, the second light emitting diode 102, and the third light emitting diode 103 may be 10° or less. When the difference between the x-axis beam angle and the y-axis beam angle is set to 10° or less, light becomes uniform at any angle, which improves visibility deterioration depending on the viewing angle.

In another exemplary embodiment, the first light emitting diode 101, the second light emitting diode 102, and the third light emitting diode 103 may have different directivity patterns. For example, the directivity patterns of the respective light emitting diodes 101, 102, and 103 may include some regions which are not overlapped based on the x-axis. Alternatively, the directivity pattern of each of the light emitting diodes 101, 102, and 103 may include some regions which are not overlapped based on the y-axis. This is to effectively implement color in consideration of the light emitting efficiency of each of the light emitting diodes 101, 102, and 103.

In another exemplary embodiment, in the first light emitting diode 101, the second light emitting diode 102, and the third light emitting diode 103, the diode that emits light of the longest peak wavelength may have the smallest beam angle. More particularly, the beam angle of at least one light emitting diode that emits the light having the longest peak wavelength, among the first light emitting diode 101, the second light emitting diode 102, and the third light emitting diode 103, may be smaller than the beam angles of the other light emitting diodes. For example, the first light emitting diode 101 emitting light of the longest peak wavelength may have a smaller beam angle than that of the third light emitting diode 103 emitting light of the shortest peak wavelength. Among the x-axis beam angles of the first light emitting diode 101, the second light emitting diode 102, and the third light emitting diode 103, the difference between the largest x-axis beam angle and the smallest x-axis beam angle may be equal to or less than 30°. As another example, the difference between the x-axis beam angle of the third light emitting diode 103 and the x-axis beam angle of the first light emitting diode 101 may be equal to or less than 30°. In addition, the difference between the largest y-axis beam angle and the smallest y-axis beam angle, among the y-axis beam angles of the first light emitting diode 101, the second light emitting diode 102, and the third light emitting diode 103, may be equal to or less than 30°. For example, the difference between the y-axis beam angle of the third light emitting diode 103 and the y-axis beam angle of the first light emitting diode 101 may be equal to or less than 30°. When the difference between the x-axis beam angles or between the y-axis beam angles of the plurality of light emitting diodes 101, 102, and 103 is equal to or less than 30°, the light becomes uniform at any viewing angle, which improves visibility deterioration depending on the viewing angle.

Figure 6:
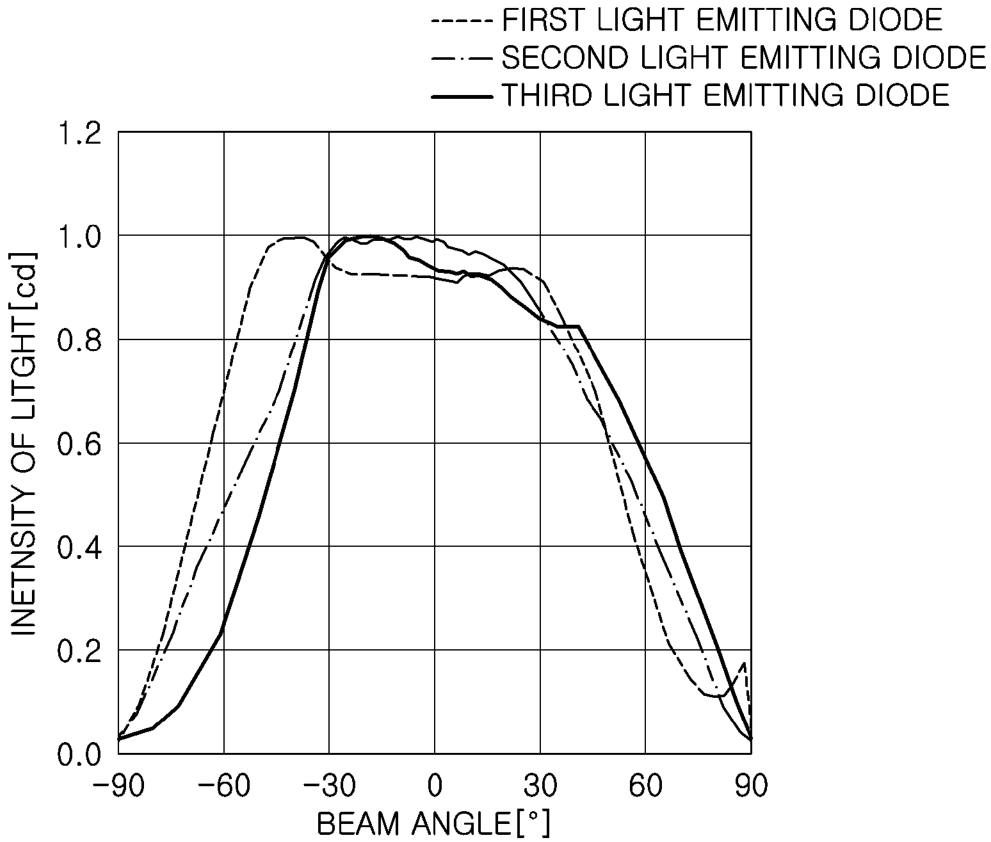
FIG. 6 is a graph illustrating light intensities of the first to third light-emitting diodes of FIG. 1 at angles with respect to the x-axis.
Figure 7:
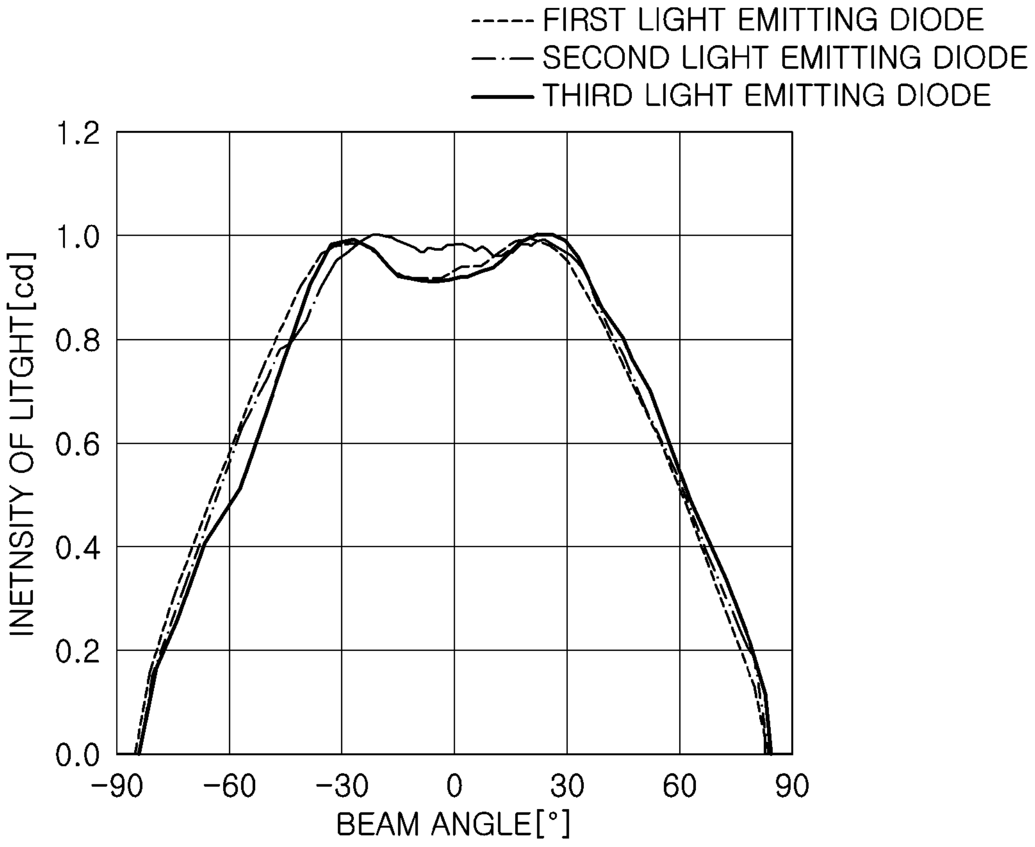
FIG. 7 is a graph illustrating light intensities of the first to third light-emitting diodes of FIG. 1 at angles with respect to the y-axis.

FIGS. 6 and 7 illustrate a beam angle and an orientation pattern represented by using the x-axis as a beam angle and the y-axis as a light emission intensity. The light emitting diode 100 may asymmetrically emit light with respect to the center of the light emitting diode 100. For example, in at least one of the light emitting diodes 101, 102, and 103, the intensity of light emitted from the center in one direction along the x-axis may be greater than the intensity of light emitted in the other direction along the x-axis, and the beam angle graph may be biased to one side of the x-axis. In addition, in at least one of the light emitting diodes 101, 102, and 103, the intensity of light emitted from the center in one direction of the y-axis may be greater than the intensity of light emitted in the other direction of the y-axis, and the beam angle graph may be biased to one side of the y-axis.

In another exemplary embodiment, at least one of the light emitting diodes 101, 102, 103 may have a higher light emission intensity at the beam angle of 20° than at the beam angle of 0°. Accordingly, even when the area of the light emitting diode is reduced, the light emitting area can be maximized by controlling the light emission intensity depending on the beam angle, and the light emission ratio between the light emitting diodes 101, 102, and 103 can be controlled.

Figure 8:
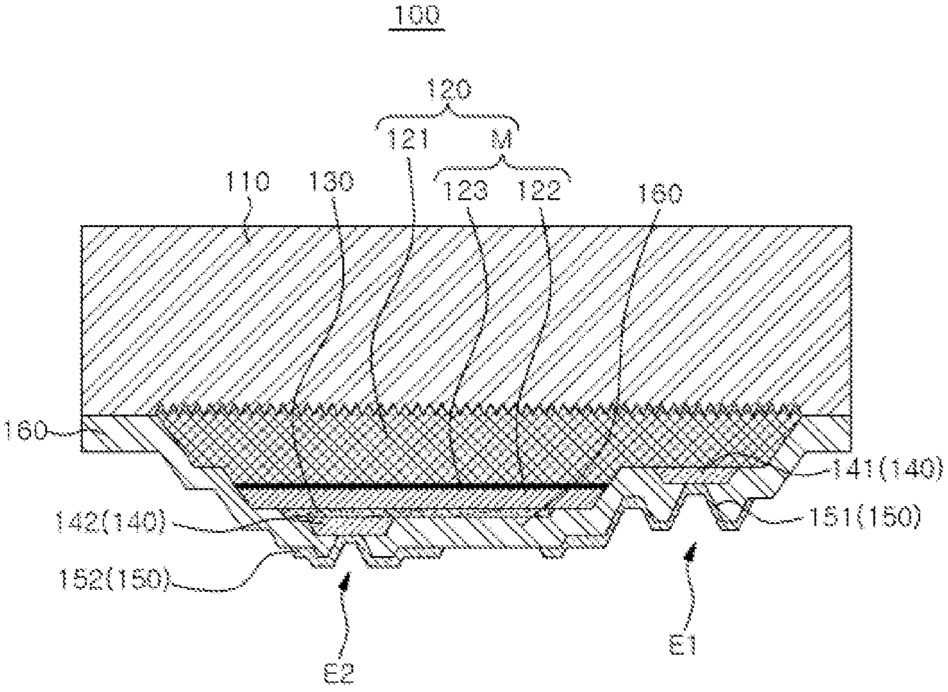
FIG. 8 is an enlarged view of a cross-section of the light emitting diode of FIG. 3.

Referring to FIG. 8, the light emitting diode 100 may include a light transmission part 110, a light emitting structure 120, an ohmic layer 130, a contact electrode 140, a bump electrode 150, and an insulating layer 160.

The light transmission part 110 may be an insulating or conductive substrate. The light transmission part 110 may be a growth substrate for growing the light emitting structure 120, and may include, for example, one of a sapphire substrate, a silicon carbide substrate, a silicon substrate, a gallium nitride substrate, and an aluminum nitride substrate. Further, the light transmission part 110 may include a light transmission material having a light transmittance of at least 70% or more. In addition, the light transmission part 110 may include, as another example, one or more of silicone molding, resin, and polymer. Furthermore, the light transmission part 110 may include a conductive material in a partial area, and the area including the conductive material may be patterned into an arbitrary shape to be distinguished. In addition, the light transmission part 110 may have an uneven portion formed on at least a portion of a surface thereof. For example, the uneven portion formed in the light transmission part 110 may include a plurality of protrusions, and the plurality of protrusions may be formed in a regular or irregular pattern. In addition, some of the plurality of protrusions on the surface of the light transmission part 110 may be positioned between the light emitting structure 120 and the light transmission part 110. The plurality of protrusions may improve extraction efficiency of light emitted from the light emitting structure 120.

The light transmission part 110 has a plurality of side surfaces extending from one surface to a rear surface of the light transmission part 110, and each of the side surfaces of the light transmission part 110 has an arbitrary angle. At least one side surface among the plurality of side surfaces of the light transmission part 110 may extend from one surface or the rear surface of the light transmission part 110 at different angles. In addition, at least one side surface of the light transmission part 110 may include a region in which inclination angles in upper and lower parts are different from each other, and the light transmission part 110 may include a roughened surface on the side surface. By forming an inclined surface or a roughened surface on one surface of the light transmission part 110, luminous efficiency of light emitted from the light emitting structure 120 may be improved. In addition, the side surface of the light transmission part 110 may extend to be inclined with respect to an upper surface of the base 310. However, the inventive concepts are not limited thereto, and in some exemplary embodiments, the side surface of the light transmission part 110 may extend to be perpendicular to the upper surface of the base 310.

The light emitting structure 120 is disposed on one surface of the light transmission part 110. The light emitting structure 120 may be provided in a long rectangular shape having a major axis and a minor axis similar to the light transmission part 110 when viewed from the top, but is not limited thereto and may have various shapes. In addition, the area of the light emitting structure 120 is smaller than the area of the light transmission part 110, and a portion of one surface of the light transmission part 110 may be exposed along the periphery of the light emitting structure 120. For example, one surface of the light transmission part 110 having the same width may be exposed at both sides of the light emitting structure 120, without being limited thereto, and the exposed one surface of the substrate may have different widths in some exemplary embodiments.

Meanwhile, a width of a lower surface of the light transmission part 110 exposed in one direction may be in a range of 6:1 to 10:1 with respect to a length of the light transmission part 110 in one direction. In particular, the ratio of the width of the light transmission part 110 exposed in a longitudinal direction to a longitudinal length of the light transmission part 110 may be about 1/10 to about 1/6. In addition, a ratio of the width of the light transmission part 110 exposed in a transverse direction to a transverse length of the light transmission part 110 may also be about 1/10 to about 1/6.

The light emitting structure 120 may generate light. The overall thickness of the light emitting structure 120 may be in a range of 1 μm to 10 μm. In addition, the light emitting structure 120 of the first light emitting diode 101 may include at least one of aluminum gallium arsenide (AlGaAs), aluminium gallium phosphide (AlGaP), indium gallium arsenide (InGaAs), indium gallium phosphide (InGaP), indium phosphide (InP), aluminum indium phosphide (AlInp), indium aluminum gallium phosphide (InAlGaP), gallium arsenide phosphide (GaAsP), aluminum gallium indium phosphide (AlGaInP), and gallium phosphide (GaP). In addition, the light emitting structure 120 of the second light emitting diode 102 may include at least one of indium gallium nitride (InGaN), gallium nitride (GaN), gallium phosphide (GaP), aluminum gallium indium phosphide (AlGaInP), aluminum gallium nitride (AlGaN), indium aluminum gallium nitride (InAlGaN), and aluminum gallium phosphide (AlGaP). In addition, the light emitting structure 120 of the third light emitting diode 103 may include at least one of gallium nitride (GaN), indium gallium nitride (InGaN), aluminum gallium nitride (AlGaN), indium aluminum gallium nitride (InAlGaN), and zinc selenide (ZnSe). The light emitting structure 120 includes a first conductivity-type semiconductor layer 121, a second conductivity-type semiconductor layer 122, and an active layer 123.

The first conductivity-type semiconductor layer 121 may have an inclined side surface. An inclination angle of the inclined side surface of the first conductivity-type semiconductor layer 121 may be about 60 degrees or less with respect to one surface or the rear surface of the light transmission part 110. In addition, the second conductivity-type semiconductor layer 122 may be disposed on the first conductivity-type semiconductor layer 121. Meanwhile, the first conductivity-type semiconductor layer 121 may include n-type impurities (e.g., Si, Ge, Sn, and Te), and the second conductivity-type semiconductor layer 122 may include p-type impurities (e.g., Mg, Sr, and Ba). In this case, the first conductivity-type semiconductor layer 121 may be an n-type semiconductor layer, and the second conductivity-type semiconductor layer 122 may be a p-type semiconductor layer. However, in some exemplary embodiments, the first conductivity-type semiconductor layer 121 may include a p-type impurity, and the second conductivity-type semiconductor layer 122 may include an n-type impurity. In addition, although the first conductivity-type semiconductor layer 121 is exemplarily illustrated as a single layer in the drawings, the first conductivity-type semiconductor layer 121 may be formed of multiple layers, and may include a superlattice layer, in other exemplary embodiments.

The active layer 123 may include a multi-quantum well (MQW) structure and may be implemented from adjusting band gap energy by adjusting a composition ratio of group 3 materials of a nitride-based semiconductor so as to emit light of a desired wavelength. The active layer 123 may be disposed between the first conductivity-type semiconductor layer 121 and the second conductivity-type semiconductor layer 122.

The first conductivity-type semiconductor layer 121, the second conductivity-type semiconductor layer 122, and the active layer 123 may include a III-V series nitride-based semiconductor, for example, a nitride-based semiconductor such as Al, Ga, or In.

Meanwhile, the light emitting structure 120 may include a mesa M including a second conductivity-type semiconductor layer 122 and an active layer 123. In particular, the second conductivity-type semiconductor layer 122 and the active layer 123 included in the light emitting structure 120 may form the mesa M. The mesa M may be disposed on a portion of the first conductivity-type semiconductor layer 121, and the mesa M may have a thickness in a range of about 1 μm to about 2 μm. In the illustrated exemplary embodiment, a portion of the first conductivity-type semiconductor layer 121 may be exposed outside the mesa M. In addition, in a partial region, an inclined surface of the mesa M is parallel to an inclined surface of the first conductivity-type semiconductor layer 121, and accordingly, an exposed surface of a lower surface of the first conductivity-type semiconductor layer 121 may be limited to one side of the mesa M. However, the inventive concepts are not limited thereto, and the lower surface of the first conductivity-type semiconductor layer 121 may be exposed along the periphery of the mesa M. In another exemplary embodiment, a through hole (not shown) or a groove (not shown) may be formed in the mesa M to expose the first conductivity-type semiconductor layer 121.

Meanwhile, when viewed in the up-down direction, the first conductivity-type semiconductor layer 121 and the mesa M may be divided into a region in which they overlap each other, and a region in which the first conductivity-type semiconductor layer 121 and the mesa M do not overlap each other. In this case, light may be emitted through the region in which the first conductivity-type semiconductor layer 121 and the mesa M do not overlap each other. For example, the region where the first conductivity-type semiconductor layer 121 overlaps the mesa M may be larger than the region where the first conductivity-type semiconductor layer 121 does not overlap the mesa M. In addition, the region where the first conductivity-type semiconductor layer 121 and the mesa M overlap each other may be biased to one side from the center of the x-axis of the light emitting diode 100 and may be biased to one side from the center of the y-axis. In this case, the light emitting diode 100 may emit light so that the light is biased to one side of the x-axis or y-axis. More particularly, the intensity of the light emitted from the light emitting diode 100 may be asymmetrically formed without being symmetrical with respect to each of the x-axis and the y-axis.

The ohmic layer 130 may be in ohmic contact with the first conductivity-type semiconductor layer 121 or the second conductivity-type semiconductor layer 122, and the ohmic layer 130 may be disposed on the light emitting structure 120. The ohmic layer 130 may be formed of a transparent electrode. For example, the transparent electrode of the ohmic layer 130 may include a light transmissive conductive oxide layer, such as indium tin oxide (ITO), zinc oxide (ZnO), zinc indium tin oxide (ZITO), zinc indium oxide (ZIO), zinc tin oxide (ZTO), gallium indium tin oxide (GITO), gallium indium oxide (GIO), gallium zinc oxide (GZO), aluminum doped zinc oxide (AZO), fluorine tin oxide (FTO), or the like. In some exemplary embodiments, the conductive oxide layer may include various dopants. The ohmic layer 130 has excellent ohmic contact characteristics with the second conductivity-type semiconductor layer 122. In particular, since the conductive oxide, such as ITO or ZnO, has a relatively lower contact resistance with the second conductivity-type semiconductor layer 122 than a metallic electrode, the transparent electrode including the conductive oxide may be applied to reduce a forward driving voltage Vf of the light emitting diode 100, thereby improving light emission efficiency. For example, when the size of the light emitting diode 100 is miniaturized, the current density is relatively low and thus the ohmic characteristics are greatly affected. In this case, it is possible to more effectively improve luminous efficiency by improving ohmic characteristics by using the transparent electrode. Also, the conductive oxide is less likely to be peeled off from the nitride-based semiconductor layer than a metallic electrode, and is stable even when used for a long time. By using the transparent electrode including such a conductive oxide, the reliability of the light emitting diode 100 can be improved.

Meanwhile, the transparent electrode may have a thickness within a range of about 400 Å to 3000 Å, without being limited thereto. When the thickness of the transparent electrode is excessively thick, light passing through the transparent electrode may be absorbed to cause a loss, and the thickness of the transparent electrode is limited to 3000 Å or less. The transparent electrode may be formed on the second conductivity-type semiconductor layer 122. In another exemplary embodiment, the second conductivity-type semiconductor layer 122 may entirely cover a lower surface of the second conductivity-type semiconductor layer 122, thereby improving current spreading efficiency when the light emitting diode 100 is driven. In still another exemplary embodiment, side surfaces of the transparent electrode may also be formed along side surfaces of the mesa M. The transparent electrode of the ohmic layer 130 may be formed on the second conductivity-type semiconductor layer 122 after the light emitting structure 120 is formed, or may be formed on the second conductivity-type semiconductor layer 122 before the mesa M is etched.

The contact electrode 140 may be electrically connected to the light emitting structure 120 and the bump electrode 150. The contact electrode 140 may include a first contact electrode 141 and a second contact electrode 142.

The first contact electrode 141 may be electrically connected to the first conductivity-type semiconductor layer 121 and a first bump electrode 151 to be described later. The first contact electrode 141 may make ohmic-contact with a region of the first conductivity-type semiconductor layer 121, which is exposed by the mesa M. In addition, the first contact electrode 141 may include an ohmic metal layer that makes ohmic-contact with the first conductivity-type semiconductor layer 121. The first contact electrode 141 may be disposed so as not to overlap the second conductivity-type semiconductor layer 122 and the active layer 123. In this case, an insulating layer disposed below the first contact electrode 141 for insulating the first contact electrode 141 from the second conductivity-type semiconductor layer 122 can be omitted. In addition, the first contact electrode 141 may be formed on the light emitting structure 120 connected to the ohmic layer 130 by using, for example, a lift-off process. The first contact electrode 141 may be spaced apart from the mesa M by a sufficient distance, and the distance may be greater than a thickness of the insulating layer 160. However, when the separation distance of the first contact electrode 141 from the mesa M is excessively large, the light emitting area is reduced, and thus the separation distance may be smaller than a diameter of the first contact electrode 141.

The second contact electrode 142 may be electrically connected to the ohmic layer 130 and a second bump electrode 152 to be described later. The second contact electrode 142 may be electrically connected to the ohmic layer 130. In addition, the second contact electrode 142 may be spaced apart from the first contact electrode 141.

The bump electrode 150 may be electrically connected to the contact electrode 140 and the conductive material 400. The bump electrode 150 may include a first bump electrode 151 and a second bump electrode 152.

The first bump electrode 151 may be electrically connected to the first contact electrode 141 and the conductive material 400 (see FIG. 3). The first bump electrode 151 may be laminated on the insulating layer 160 and may be connected to the first contact electrode 141 through an opening formed in the insulating layer 160.

The second bump electrode 152 may be electrically connected to the second contact electrode 142 and the conductive material 400. The second bump electrode 152 may be laminated on the insulating layer 160 and may be connected to the second contact electrode 142 through an opening formed in the insulating layer 160.

The insulating layer 160 may cover the light transmission part 110, the light emitting structure 120, and the contact electrode 140. The insulating layer 160 covers an upper region and the side surfaces of the mesa M, and covers the first conductivity-type semiconductor layer 121 exposed around the mesa M and the side surfaces of the first conductivity-type semiconductor layer 121. In addition, the insulating layer 160 covers one surface of the light transmission part 110 exposed around the first conductivity-type semiconductor layer 121 and covers a region between the contact electrode 140 and the mesa M. Meanwhile, the insulating layer 160 has a plurality of openings exposing the contact electrode 140. Each of the plurality of openings has a size smaller than the area of the contact electrode 140, and is restrictively positioned on the contact electrode 140. The insulating layer 160 may be a single layer formed of a single material, or may be an insulating reflective layer formed of a plurality of layers in a different form.

When the insulating layer 160 is formed as the insulating reflective layer, the insulating layer 160 includes a distributed Bragg reflector. The distributed Bragg reflector may be formed by repeatedly laminating a plurality of dielectric layers having different refractive indices, and the plurality of dielectric layers may include at least one of $TiO_2$, $SiO_2$, $HfO_2$, $ZrO_2$, $Nb_2O_5$, and $MgF_2$. For example, the insulating layer 160 may have a structure in which $TiO_2$ layer/$SiO_2$ layer are alternately laminated. The distributed Bragg reflector is manufactured to reflect light generated in the active layer 123 and is formed of a plurality of pairs of dielectric layers to improve reflectivity. According to an exemplary embodiment, the distributed Bragg reflector may include 10 to 25 pairs. In addition, the insulating layer 160 may include an additional insulating layer together with the distributed Bragg reflector, and for example, may include an interface layer positioned under the distributed Bragg reflector or a protective layer covering the distributed Bragg reflector in order to improve adhesion between the distributed Bragg reflector and the underlying layer. The interface layer may be formed of, for example, a $SiO_2$ layer, and the protective layer may be formed of $SiO_2$ or $SiN_x$.

Meanwhile, the insulating layer 160 may have a thickness of about 2 μm to 5 μm. The distributed Bragg reflector may have a reflectivity of 90% or more with respect to light generated in the active layer 123, and a reflectivity close to 100% may be provided by controlling the types, thicknesses, laminating periods, and the like of the plurality of dielectric layers forming the distributed Bragg reflector. Moreover, the distributed Bragg reflector may have high reflectivity for visible light other than light generated in the active layer 123.

The light emitting diode 100 according to an exemplary embodiment may include a first terminal E1 and a second terminal E2. The first terminal E1 may be formed by the first conductivity-type semiconductor layer 121, the first contact electrode 141, and the first bump electrode 151. In particular, the first terminal E1 may be a portion electrically connected to the first conductivity-type semiconductor layer 121, the first contact electrode 141, and the first bump electrode 151. In addition, the second terminal E2 may be formed by electrically connecting the second conductivity-type semiconductor layer 122, the second contact electrode 142, and the second bump electrode 152 to each other. The first terminal E1 and the second terminal E2 may have different poles from each other. For example, when the first conductivity-type semiconductor layer 121 is an n-type semiconductor layer, the first terminal E1 may be an n-pole, and when the second conductivity-type semiconductor layer 122 is a p-type semiconductor layer, the second terminal E2 may be a p-pole. However, the inventive concepts are not limited thereto, and the first terminal E1 may be the p-pole and the second terminal E2 may be the n-pole in some exemplary embodiments.

Referring back to FIGS. 1 and 2, each of the plurality of light emitting diodes 101, 102, and 103 may be arranged, such that the first terminal E1 and the second terminal E2 are spaced apart from each other along the x-axis. In addition, a virtual line connecting the center of the first terminal E1 and the center of the second terminal E2 of any one of the plurality of light emitting diodes 101, 102, and 103 may be parallel to a virtual line connecting the center of the first terminal E1 and the center of the second terminal E2 of another light emitting diode. For example, the virtual line connecting the centers of the first terminal E1 and the second terminal E2 of the first light emitting diode 101 may be parallel to the virtual line connecting the centers of the first terminal E1 and the second terminal E2 of the second light emitting diode 102. In this case, the virtual line connecting the centers of the first terminal E1 and the second terminal E2 may be parallel to the x-axis. In addition, the plurality of light emitting diodes 101, 102, and 103 may be arranged to be spaced apart from each other along the y-axis. The arrangement of the first terminal E1 and the second terminal E2 of any one of the plurality of light emitting diodes 101, 102, and 103 may be opposite to the arrangement of the first terminal E1 and the second terminal E2 of the others of the plurality of light emitting diodes 101, 102, and 103. For example, the arrangement of the first terminal E1 and the second terminal E2 of the first light emitting diode 101 emitting the light having the longest wavelength among the first light emitting diode 101, the second light emitting diode 102, and the third light emitting diode 103 may be opposite to that of the others. In particular, the first light emitting diode 101 may be arranged such that the first terminal E1 faces one side of the x-axis, and the second light emitting diode 102 and the third light emitting diode 103 may be arranged such that the first terminal E1 faces the other side of the x-axis. In this case, the first light emitting diode 101 is disposed on the substrate 300 such that the second terminal E2 and the first terminal E1 are disposed to have opposite polarities. Accordingly, when any one of the plurality of first terminals E1 or the plurality of second terminals E2 is formed as the common electrode, the wiring length of the electrode may be shortened, and the circuit wirings may be prevented from crossing, thereby preventing an electrical short.

Referring again to FIG. 3, the molding part 200 can protect the light emitting diode 100 and improve light extraction efficiency of the light emitting diode 100. For example, the molding part 200 may cover the light emitting diode 100 and have a refractive index different from that of the light emitting diode 100, thereby effectively refracting light emitted from the light emitting diode 100. In addition, the molding part 200 has a predetermined thickness. For example, a thickness of the molding part 200 from an upper surface of the substrate 300 to an upper end of the molding part 200 may be greater than a thickness from the upper surface of the substrate 300 to an upper end of the light emitting diode 100. Preferably, when the thickness of the light emitting diode 100 is "a" and the thickness from an upper surface of the light emitting diode 100 to the upper surface of the molding part 200 is "b", a:b may be 1:1 to 1:3. For example, the thickness of the light emitting diode 100 may be a thickness from the upper surface of the light transmission part 110 to the first conductivity-type semiconductor layer 121. The molding part 200 may be formed of a material including at least one of a silicone-based material, an epoxy-based material, a polymethyl methacrylate (PMMA)-based material, a polyethylene (PE)-based material, and a polystyrene (PS)-based material. For example, the molding part 200 may include a black-based material. However, the inventive concepts are not limited thereto, and the molding part 200 may include transparent epoxy, transparent silicone resin, or the like. In addition, a diffusing agent 210 may be provided in the molding part 200. The diffusing agent 210 may control the transparency of the molding part 200. For example, when the diffusing agent 210 is distributed at a high ratio in the molding part 200, the transparency of the molding part 200 may be lowered, and when the diffusing agent 210 is distributed at a low ratio, the transparency of the molding part 200 may be increased. The diffusing agent 210 may include at least one of titanium dioxide ($TiO_2$) and silicon dioxide ($SiO_2$) having high light reflectivity. In addition, a plurality of the diffusing agents 210 may be provided, and may be uniformly or non-uniformly distributed in the molding part 200. Accordingly, a clearer contrast can be realized.

Figure 9:
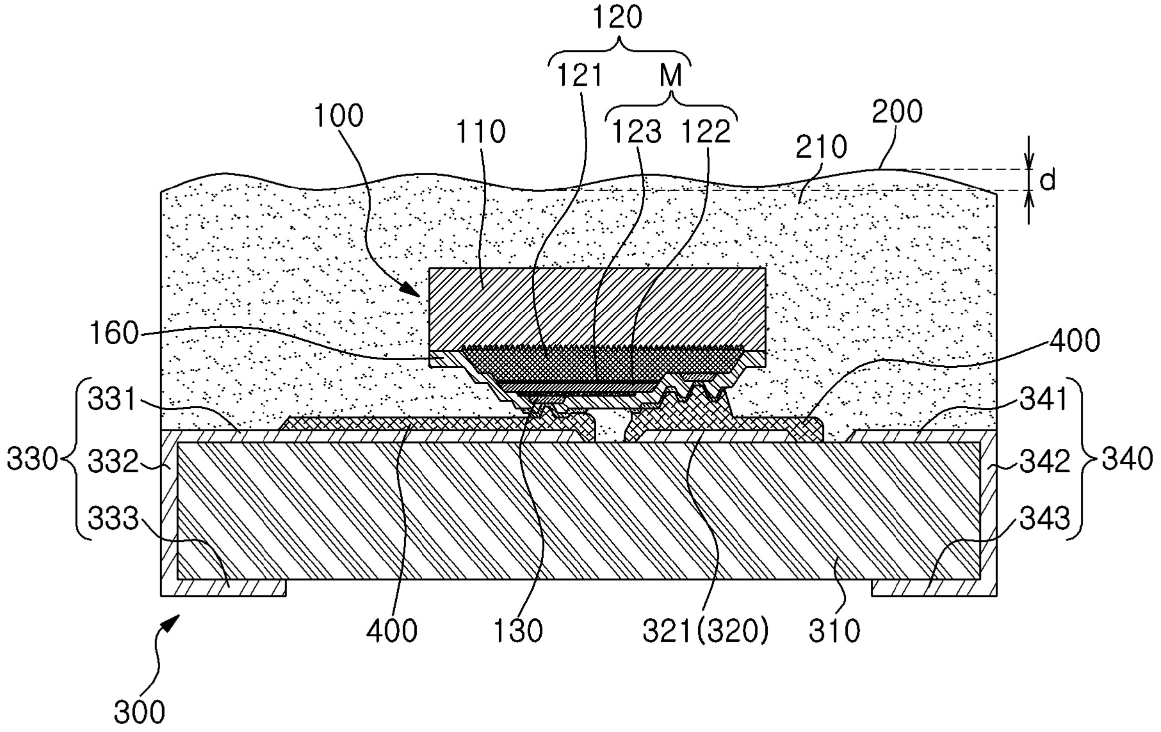
FIG. 9 is a view of the light emitting device in which an upper surface of a molding part of FIG. 3 is roughened.

Referring to FIG. 9, the upper surface of the molding part 200 may be roughened to have a predetermined roughness. In this case, when the light emitting diode 100 is viewed from the outside, reflection of light can be prevented. A height difference "d" of the roughness may be equal to or less than 10 μm. When the difference in roughness becomes too large, uniformity of light may be lowered, so it is preferable to be 10 μm or less.

Figure 10:
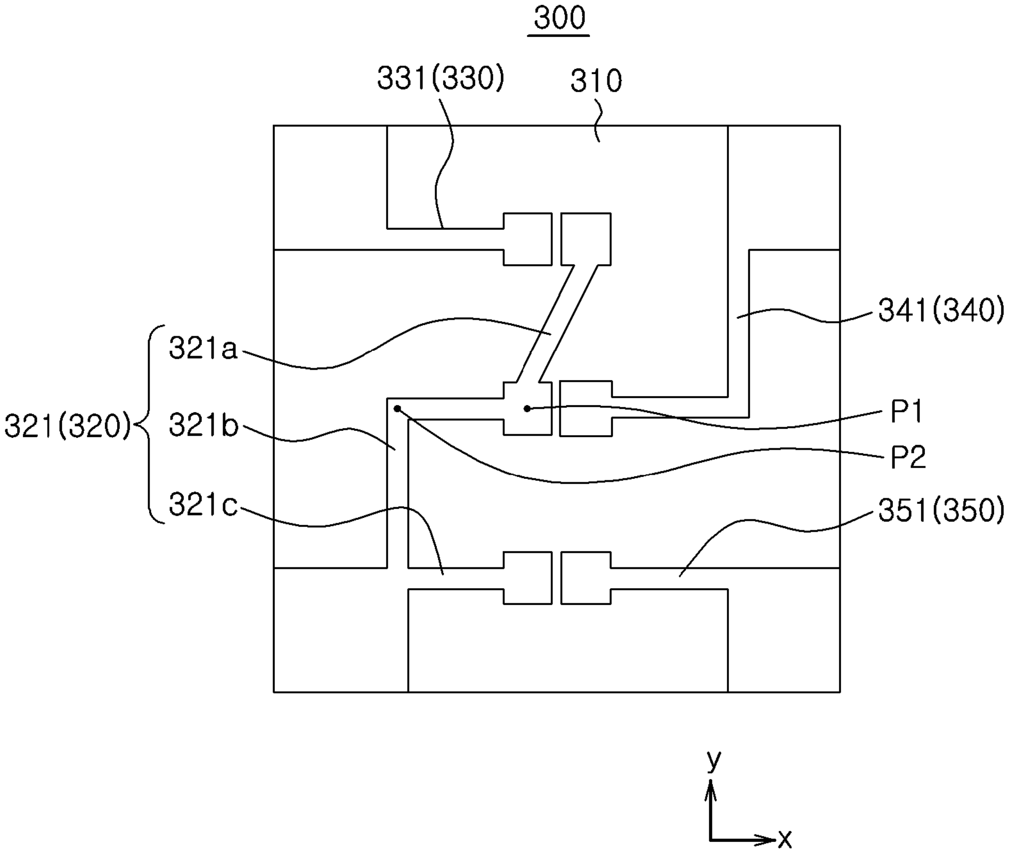
FIG. 10 is a plan view schematically illustrating a substrate of FIG. 1.

Referring to FIGS. 3 and 10, the substrate 300 may support the light emitting diode 100 and the molding part 200. The substrate 300 may include wirings so that the light emitting diode 100 may be electrically connected. For example, the substrate 300 may be a printed circuit board (PCB) or a thin film transistor (TFT) substrate. The substrate 300 may include a base 310 and substrate electrodes 320, 330, 340, and 350.

Figure 11:
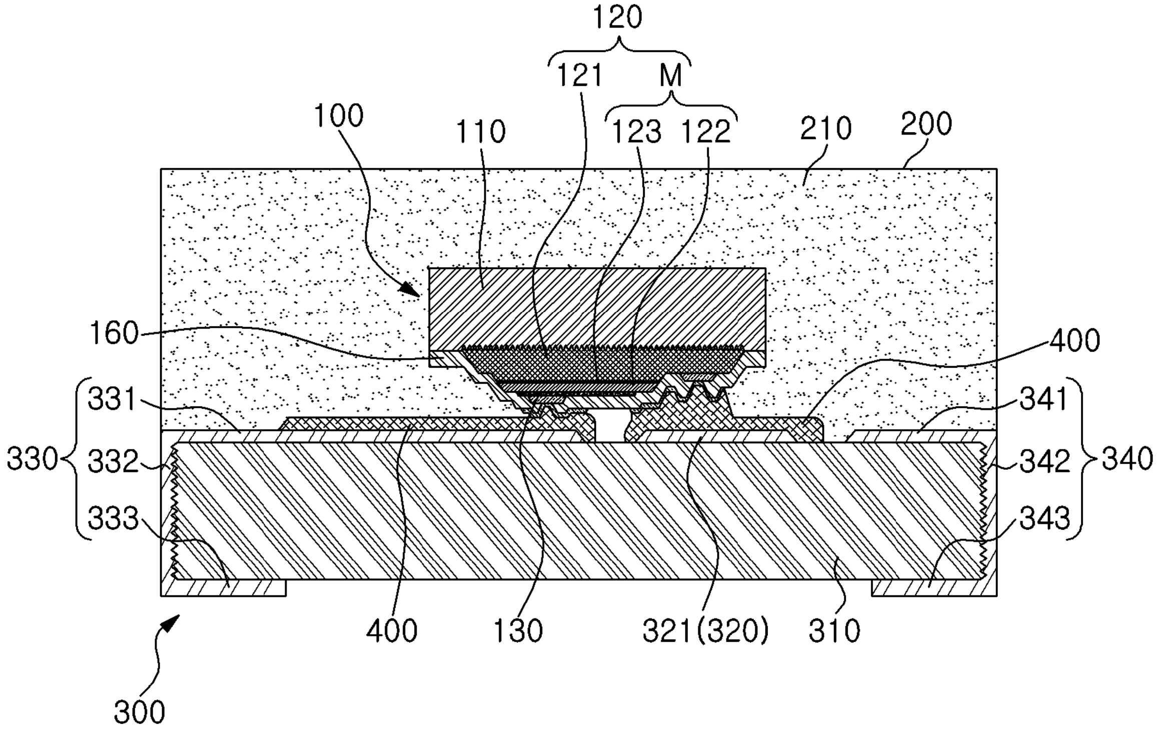
FIG. 11 is a view of the light emitting device in which an uneven portion is formed on a side surface of a base of FIG. 3.

The base 310 may support a first substrate electrode 320, a second substrate electrode 330, a third substrate electrode 340, and a fourth substrate electrode 350. The base 310 may be provided in a rectangular shape having a major axis and a minor axis. Alternatively, the base 310 may be provided in a square shape having four sides of the same length. In addition, at least a portion of each of an upper surface, side surfaces, and a lower surface of the base 310 may be surrounded by the first substrate electrode 320, the second substrate electrode 330, the third substrate electrode 340, and the fourth substrate electrode 350. The base 310 may have a predetermined thickness and may be connected to an external power source. In addition, the base 310 may include, for example, at least one of Cu, Zn, Au, Ni, Al, Mg, Cd, Be, W, Mo, Si, and Fe, or an alloy thereof. The side surfaces of the base 310 may extend in parallel to the substrate electrodes 320, 330, 340, and 350, and the uneven portions may be non-uniformly formed. In particular, referring to FIG. 11, at least a portion of the side surfaces of the base 310 may be provided with the uneven portion, and the uneven portion formed on the side surfaces of the base 310 may be in contact with the substrate electrodes 320, 330, 340, and 350. In this case, a coupling force between the side surfaces of the base 310 and the substrate electrodes 320, 330, 340, and 350 may be increased.

The substrate electrodes 320, 330, 340, and 350 may be disposed between the light emitting diode 100 and an external substrate (not shown) to electrically connect the light emitting diode 100 and the external substrate. The substrate electrodes 320, 330, 340, and 350 may extend to at least partially cover the upper surface, the side surfaces, and the lower surface of the base 310. For example, the substrate electrodes 320, 330, 340, and 350 may extend from one surface (for example, the upper surface of FIG. 3) of the base 310 on which the plurality of light emitting diodes 101, 102, and 103 are placed to surround the outer surface (for example, the left side surface or the right side surface of FIG. 3) of the base 310. In addition, in order to cover a portion of the other surface (for example, the lower surface of FIG. 3) opposite to the one surface of the base 310 on which the light emitting diodes 100 are placed, the substrate electrodes 320, 330, 340, and 350 may extend from the one surface to the other surface through the outer surface. In addition, the plurality of substrate electrodes 320, 330, 340, and 350 may be provided, and the plurality of substrate electrodes 320, 330, 340, and 350 may be insulated from each other. The plurality of substrate electrodes 320, 330, 340, and 350 may include a first substrate electrode 320, a second substrate electrode 330, a third substrate electrode 340, and a fourth substrate electrode 350.

Figure 12:
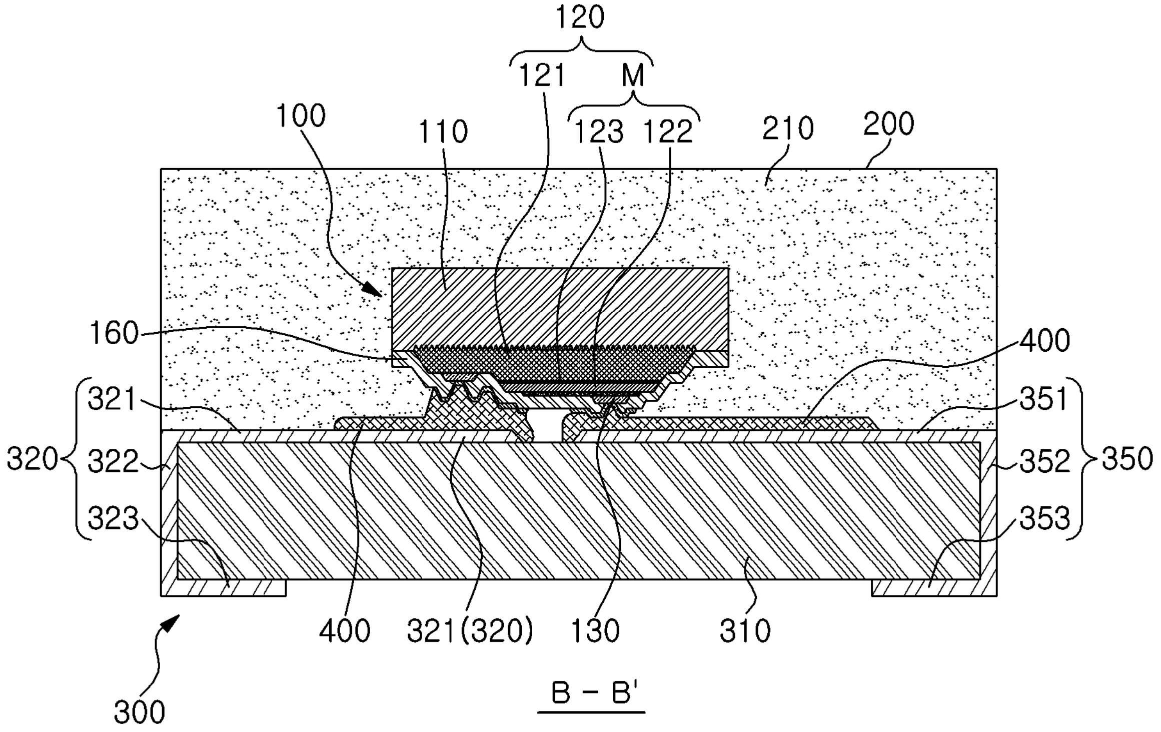
FIG. 12 is a cross-sectional view of the light emitting device taken along line B-B' of FIG. 1.

Referring to FIGS. 10 and 12, the first substrate electrode 320 may be connected to the first terminal E1 of the first light emitting diode 101, the first terminal E1 of the second light emitting diode 102, and the first terminal E1 of the third light emitting diode 103. The first substrate electrode 320 may include a first upper pattern 321, a first side pattern 322, and a first lower pattern 323.

The first upper pattern 321 may electrically connect the first terminal E1 of the first light emitting diode 101, the first terminal E1 of the second light emitting diode 102, and the first terminal E1 of the third light emitting diode 103. The first upper pattern 321 may be disposed on the upper surface of the base 310. For example, at least a portion of the first upper pattern 321 may extend between adjacent portions of the plurality of light emitting diodes 101, 102, and 103. In addition, the first upper pattern 321 may include a portion that is at least partially bent, and the bent portion may be provided at two or more points. For example, the first upper pattern 321 may be bent at one point P1 and at another point P2 different from the one point P1. The first upper pattern 321 may include a first pattern connection portion 321*a*, a second pattern connection portion 321*b*, and a third pattern connection portion 321*c*.

One side of the first pattern connection portion 321*a* may be connected to the first terminal E1 of the first light emitting diode 101, and the other side thereof may be connected to the second pattern connection portion 321*b*. The first pattern connection portion 321*a* may extend to be inclined with respect to the x-axis and the y-axis. In particular, the first pattern connection portion 321*a* may extend in a direction that deviates from the orientation of the light emitting diode 100. In addition, the first pattern connection portion 321*a* may be disposed between the first light emitting diode 101 and the second light emitting diode 102.

Figure 13:
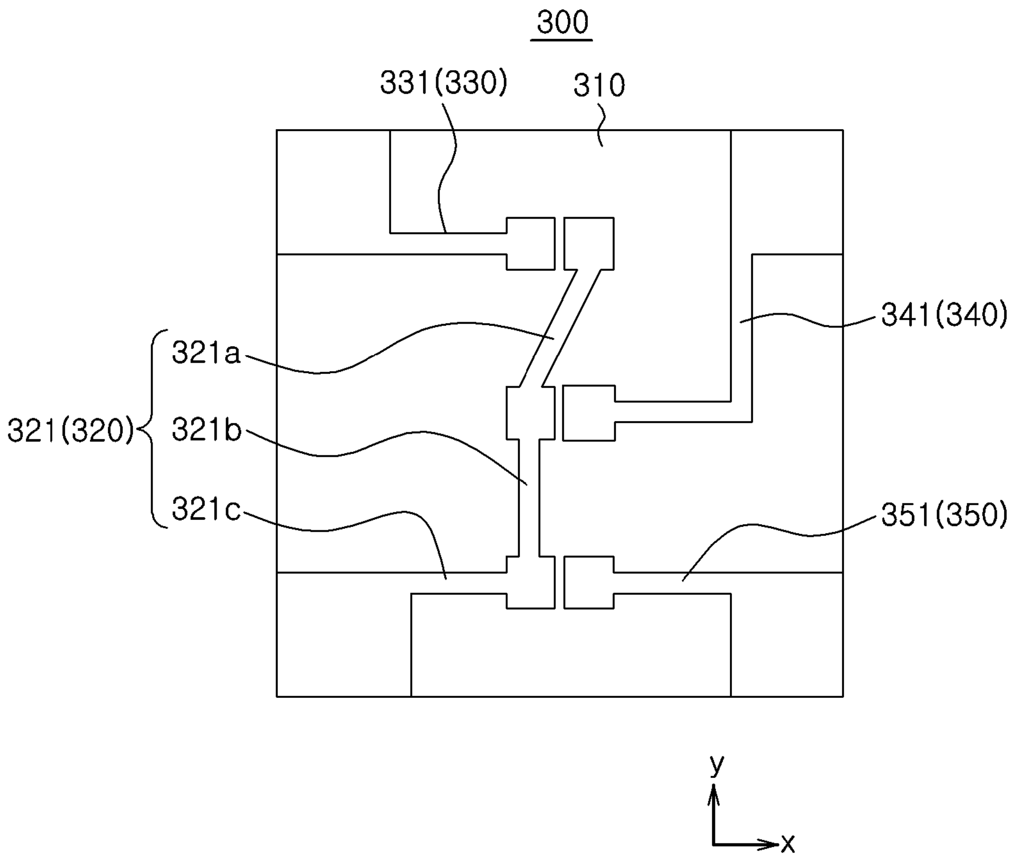
FIG. 13 is a diagram of a substrate in which a second pattern connection portion of FIG. 10 has a linear shape.

One side of the second pattern connection portion 321*b* may be connected to the first terminal E1 of the second light emitting diode 102, and the other side thereof may be connected to the third pattern connection portion 321*c*. The first terminal E1 of the second light emitting diode 102 and the first pattern connection portion 321*a* may be connected to one side of the second pattern connection portion 321*b*. In addition, at least a portion of the second pattern connection portion 321*b* may be bent, but is not limited thereto, and as illustrated in FIG. 13, the first terminal E1 of the second light emitting diode 102 and the first terminal E1 of the third light emitting diode 103 may be connected in a linear shape.

The third pattern connection portion 321*c* may have one side connected to the first terminal E1 of the third light emitting diode 103 and the other side connected to the first side pattern 322. At least a portion of the third pattern connection portion 321*c* may be bent, or may include a region having a different width. The third pattern connection portion 321*c* may extend in parallel to the upper surface of the base 310 and may be connected to the first side pattern 322. However, the inventive concepts are not limited thereto, and the third pattern connection portion 321*c* may be connected to the first side pattern 322 so that a portion connected to the first side pattern 322 protrudes upward.

Figure 14:
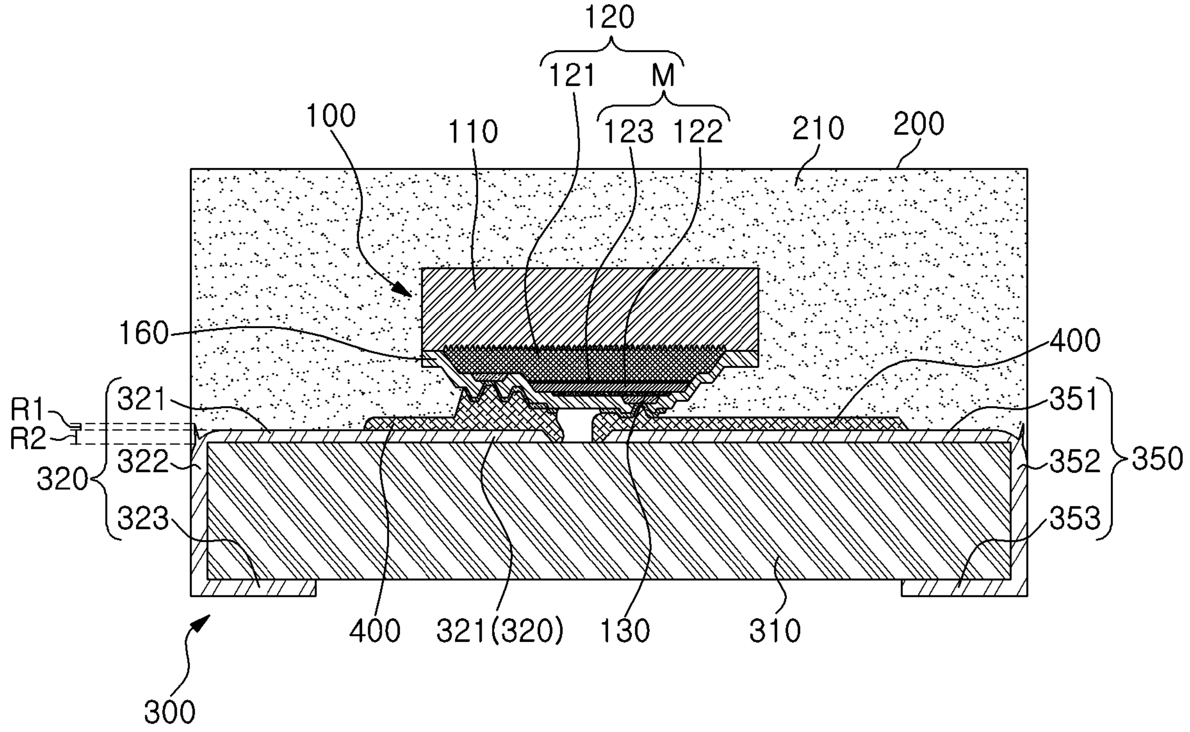
FIG. 14 is a view of the light emitting device in which a third pattern connection portion of FIG. 12, which is connected to a first side pattern, protrudes upward.

Referring to FIG. 14, at least one of the plurality of side patterns 322, 332, 342, and 352 may include a first region R1, which is a partial region having a height higher than those of upper patterns 321, 331, 341, and 351. The first region R1 may have a shape in which the width gradually narrows as it goes upward. Since the first region R1 having the height higher than those of the upper patterns 321, 331, 341, and 351 is disposed, light generated from the light emitting device 1 may be blocked so as not to affect the adjacent light emitting device 1, which results in effectively improved contrast.

In addition, at least one of the plurality of side patterns 322, 332, 342, and 352 may further include a second region R2, which is a partial region having a height lower than those of the upper patterns 321, 331, 341, and 351.

The first side pattern 322 may electrically connect the first upper pattern 321 and the first lower pattern 323. The first side pattern 322 may extend to cover the side surface of the base 310.

Figure 15:
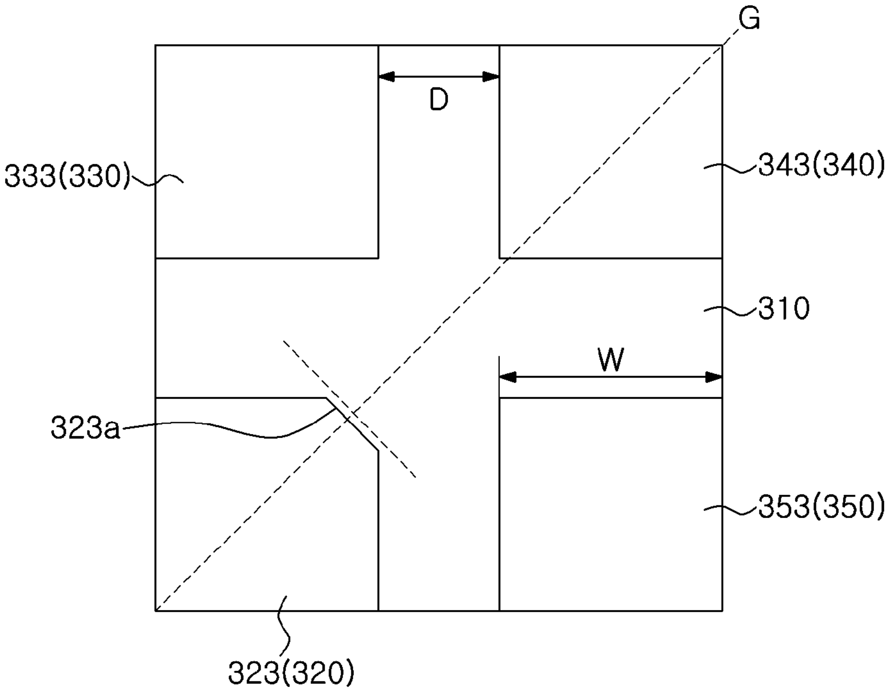
FIG. 15 is a rear view schematically illustrating the substrate of FIG. 1.

Referring to FIG. 15, the first lower pattern 323 may electrically connect the light emitting device 1 to an external substrate. The first lower pattern 323 may have an area smaller than those of a second lower pattern 333, a third lower pattern 343, and a fourth lower pattern 353, which will be described later, when the base 310 is viewed from the side where the lower surface of the base 310 is located. In particular, the area of the lower part of the substrate electrode 320 connected to the first terminal E1 of the plurality of light emitting diodes 100 may be smaller than the area of the lower part of the substrate electrode 330, 340, or 350 connected to the second terminal E2 of the plurality of light emitting diodes 100. In addition, the first lower pattern 323 may have a perpendicular surface 323*a* extending in a direction perpendicular to an imaginary line G extending along a diagonal line of the base 310. Accordingly, even when the conductive material 400 to be connected to the external substrate is disposed between the lower patterns 323, 333, 343, and 353 and the external substrate, by reducing the area of at least one lower pattern, it is possible to prevent the conductive material 400 from extending to the adjacent lower patterns 323, 333, 343, and 353 and cause short-circuit.

Referring to FIGS. 3, 10, and 15, the second substrate electrode 330 may be connected to the second terminal E2 of the first light emitting diode 101. The second substrate electrode 330 may include a second upper pattern 331, a second side pattern 332, and a second lower pattern 333.

One side of the second upper pattern 331 may be connected to the second terminal E2 of the first light emitting diode 101, and the other side thereof may be connected to the second side pattern 332. The second upper pattern 331 may be disposed on the upper surface of the base 310. In addition, at least a portion of the second upper pattern 331 may be bent.

The second side pattern 332 may electrically connect the second upper pattern 331 and the second lower pattern 333. The second side pattern 332 may extend to cover the side surface of the base 310.

The second lower pattern 333 may electrically connect the light emitting device 1 to an external substrate. The second lower pattern 333 may be disposed on the lower surface of the base 310.

Referring to FIGS. 3, 10, and 15, the third substrate electrode 340 may be connected to the second terminal E2 of the second light emitting diode 102. The third substrate electrode 340 may include a third upper pattern 341, a third side pattern 342, and a third lower pattern 343.

One side of the third upper pattern 341 may be connected to the second terminal E2 of the second light emitting diode 102 and the other side thereof may be connected to the third side pattern 342. The third upper pattern 341 may be disposed on the upper surface of the base 310. In addition, at least a portion of the third upper pattern 341 may be bent. Meanwhile, the third upper pattern 341 may be disposed to be point-symmetric to the second pattern connection portion 321*b* of the first upper pattern 321 with respect to the center of the second light emitting diode 102. More particularly, when the third upper pattern 341 is rotated about the center of the second light emitting diode 102, it may correspond to the second pattern connection portion 321*b*.

The third side pattern 342 may electrically connect the third upper pattern 341 and the third lower pattern 343. The third side pattern 342 may extend to cover the side surface of the base 310.

The third lower pattern 343 may electrically connect the light emitting device 1 to an external substrate. The third lower pattern 343 may be disposed on the lower surface of the base 310. In addition, the third lower pattern 343 may be disposed to be point-symmetric to the first lower pattern 323 with respect to the center of the base 310.

Referring to FIGS. 10, 12, and 15, the fourth substrate electrode 350 may be connected to the second terminal E2 of the third light emitting diode 103. The fourth substrate electrode 350 may include a fourth upper pattern 351, a fourth side pattern 352, and a fourth lower pattern 353.

One side of the fourth upper pattern 351 may be connected to the second terminal E2 of the third light emitting diode 103 and the other side thereof may be connected to the fourth side pattern 352. The fourth upper pattern 351 may be disposed on the upper surface of the base 310. In addition, at least a portion of the fourth upper pattern 351 may be bent.

The fourth side pattern 352 may electrically connect the fourth upper pattern 351 and the fourth lower pattern 353. The fourth side pattern 352 may extend to cover the side surface of the base 310.

The fourth lower pattern 353 may electrically connect the light emitting device 1 to an external substrate. The fourth lower pattern 353 may be disposed on the lower surface of the base 310. In addition, the fourth lower pattern 353 may be disposed to be point-symmetric to the second lower pattern 333 with respect to the center of the base 310.

Meanwhile, the first lower pattern 323, the second lower pattern 333, the third lower pattern 343, and the fourth lower pattern 353 may be provided to have respective widths greater than the separation distance therebetween. For example, the width "W" of the fourth lower pattern 353 may be greater than the distance "D" between the second lower pattern 333 and the third lower pattern 343 (see FIG. 15). Therefore, the lower patterns can be electrically connected to the external substrate in a stable manner, and sufficient heat dissipation paths can be secured while maintaining insulation between the lower patterns.

The conductive material 400 may fix the light emitting diode 100 to the substrate 300. One side of the conductive material 400 is connected to the light emitting diode 100, and the other side thereof is connected to the substrate 300. In addition, the conductive material 400 may electrically connect the substrate electrodes 320, 330, 340, and 350 of the substrate 300 to the bump electrodes 150 of the light emitting diode 100. The conductive material 400 may be provided in plural, and the plurality of conductive materials 400 may connect the substrate electrodes 320, 330, 340, and 350 to the plurality of light emitting diodes 100, respectively. In addition, portions where the conductive material 400 contacts the substrate electrodes 320, 330, 340, and 350 may be roughened to have a predetermined roughness.

Figure 16:
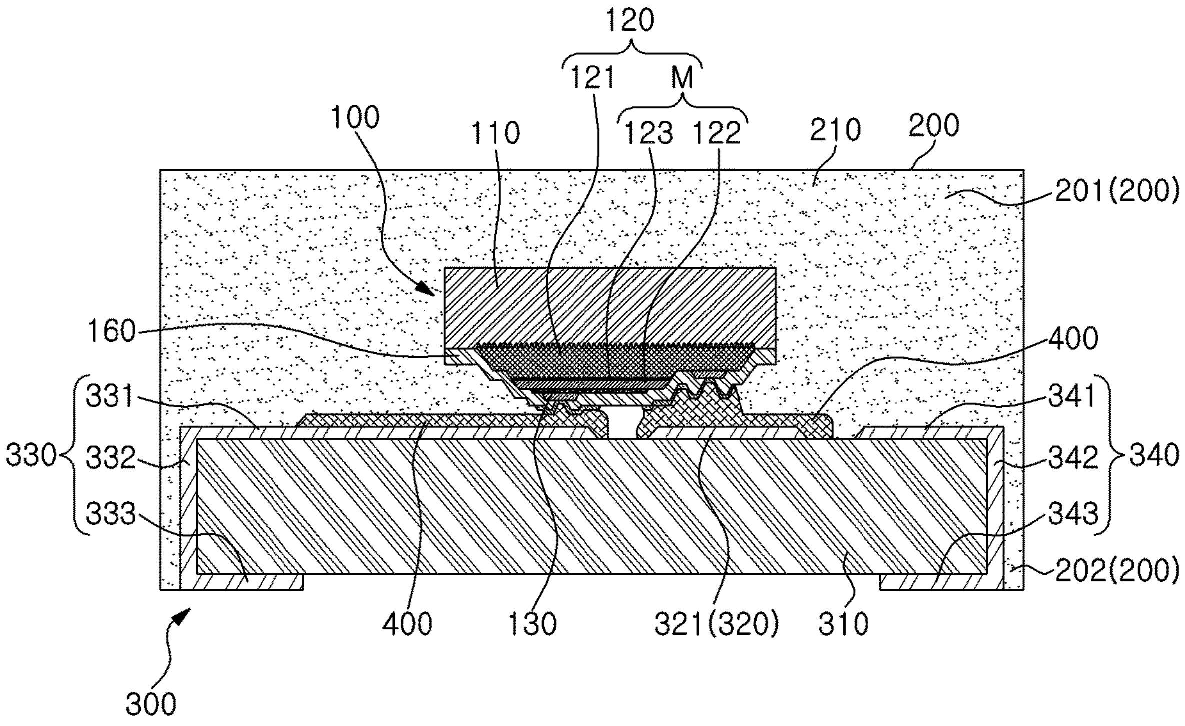
FIG. 16 is a longitudinal sectional view of a light emitting device according to a second exemplary embodiment.
Figure 17:
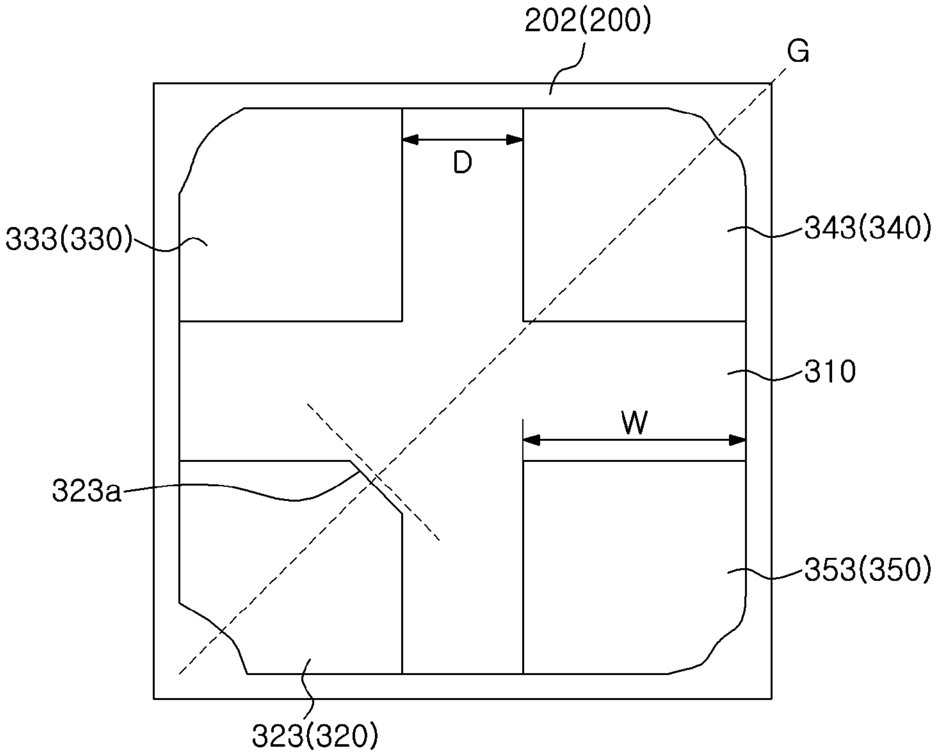
FIG. 17 is a plan view schematically illustrating a substrate of FIG. 16.

Meanwhile, in addition to above descried configurations, according to a second exemplary embodiment, the molding part 200 may extend to cover the substrate electrodes 320, 330, 340, and 350. Hereinafter, the second exemplary embodiment will be described with further reference to FIGS. 16 and 17. In the description of the second exemplary embodiment, the difference in comparison with the above-described exemplary embodiment is mainly described, and description of the same elements denoted by the same reference numerals will be omitted to avoid redundancy.

The molding part 200 may include a first molding part 201 and a second molding part 202. The first molding part 201 may cover the light emitting diode 100 to protect the light emitting diode 100. The first molding part 201 may be disposed on the upper surface of the base 310, and may extend upward from the upper surface of the base 310 to have a predetermined thickness. In addition, the first molding part 201 may cover the first upper pattern 321, the second upper pattern 331, the third upper pattern 341, and the fourth upper pattern 351.

The second molding part 202 may extend from the first molding part 201 to cover at least a portion of the substrate electrodes 320, 330, 340, and 350. The second molding part 202 may extend downward from the first molding part 201 to cover the first side pattern 322, the second side pattern 332, the third side pattern 342, and the fourth side pattern 352. In this case, the second molding part 202 may cover the first to fourth side patterns 322, 332, 342, and 352 so that any area of at least one side pattern of the first to fourth side patterns 322, 332, 342, and 352 is not exposed. Furthermore, the second molding part 202 may cover at least one pair of side patterns facing each other with no area exposed. Since the second molding part 202 entirely covers the pair of side patterns facing each other, the plurality of light emitting devices 1 disposed adjacent to each other can be arranged along a line without being tilted vertically or horizontally. More particularly, the second molding part 202 covering the pair of facing side patterns may function as a support that can minimize a height difference between the plurality of light emitting devices 1 adjacent to each other, so that the bonding strength of the plurality of light emitting devices 1 bonded to the external substrate can be improved. In addition, since the plurality of light emitting devices 1 are coupled to the external substrate without a coupling step, the light emitting surfaces of the plurality of light emitting devices 1 are substantially arranged on the same line, and thus, it is possible to mitigate color difference and minimize luminance loss of light emitted from the plurality of light emitting devices 1. Further, since the light emitting surfaces of the plurality of light emitting devices 1 are arranged on substantially the same line, it is possible to mitigate the color difference of the lights measured at various angles and minimize the luminance loss.

Figure 18:
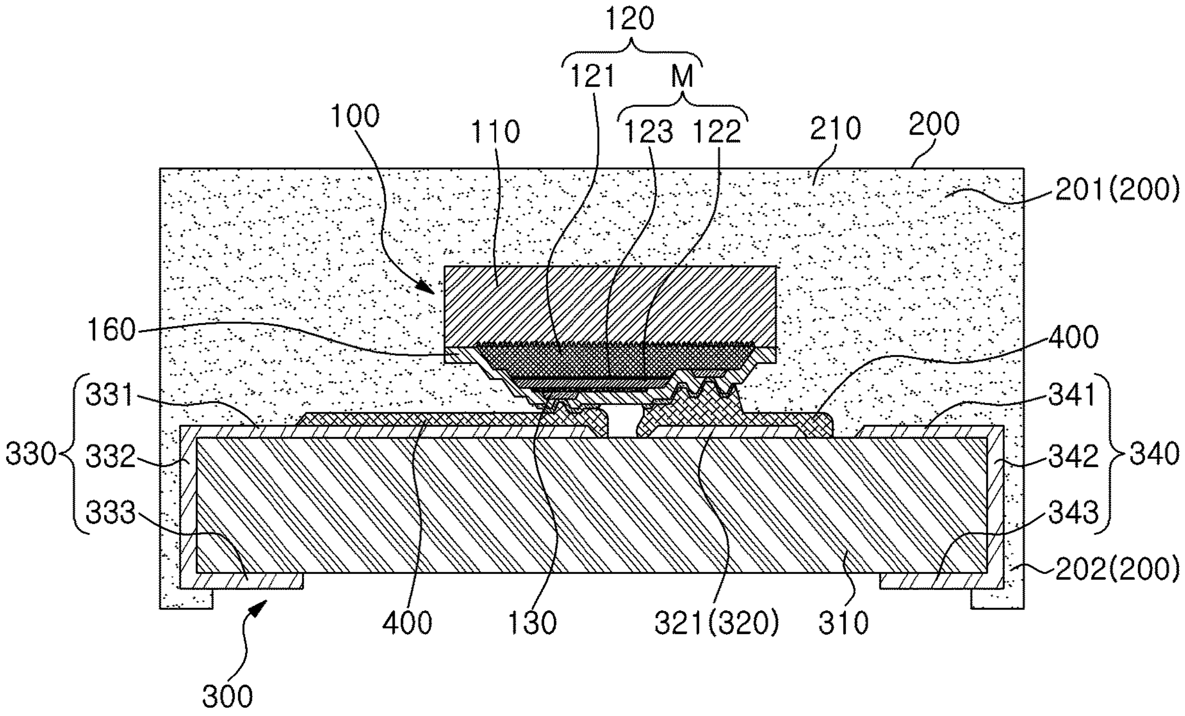
FIG. 18 is a cross-sectional view of another portion of the light emitting device of FIG. 16 taken along a longitudinal direction thereof.

Further, referring to FIG. 18, at least a portion of the second molding part 202 may cover at least a portion of the first lower pattern 323, the second lower pattern 333, the third lower pattern 343, and the fourth lower pattern 353. In this case, the first side pattern 322, the second side pattern 332, the third side pattern 342, and the fourth side pattern 352 are covered by the second molding part 202, and thus are prevented from being exposed to the outside, which enables stable driving of the device.

Figure 19:
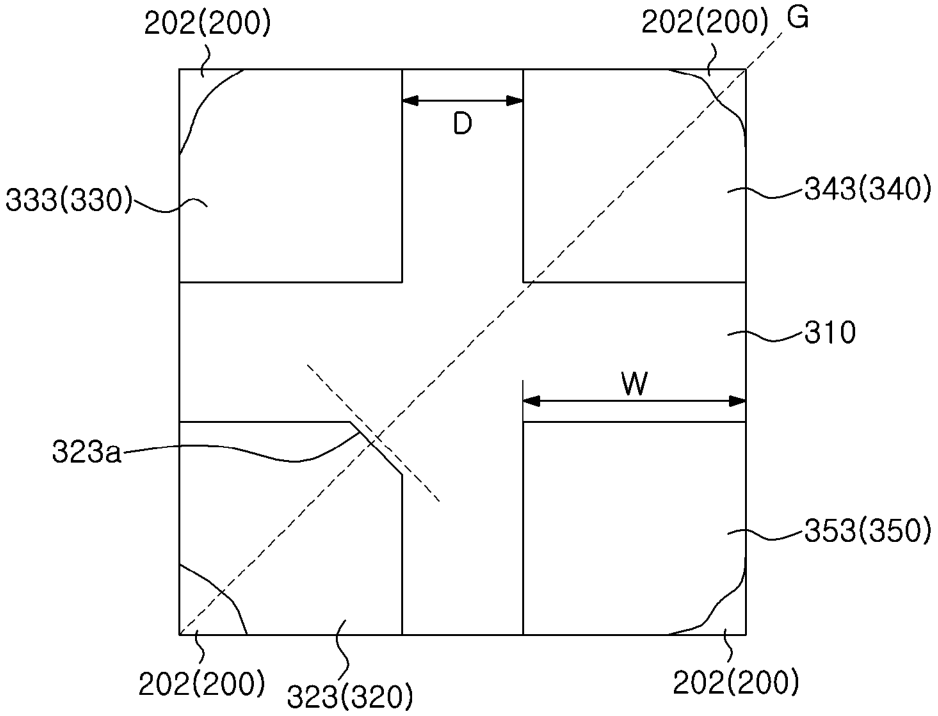
FIG. 19 is a rear view schematically illustrating a substrate according to a third exemplary embodiment.

According to a third exemplary embodiment, the second molding part 202 may cover at least a portion of the first lower pattern 323, the second lower pattern 333, the third lower pattern 343, and the fourth lower pattern 353. For example, referring to FIG. 19, the second molding part 202 may cover a portion of the first lower pattern 323 disposed adjacent to a corner portion of the lower surface of the base 310. In this case, the outer surface of the second molding part 202 and the outer surfaces of the lower patterns 323, 333, 343, and 353 or the outer surfaces of the side patterns 322, 332, 342, and 352 may be parallel to each other. In addition, portions of the side patterns 322, 332, 342, and 352 may be covered by the second molding part 202, and other portions of the side patterns 322, 332, 342, and 352 may be exposed by the second molding part 202. Since the edges of the side patterns 322, 332, 342, and 352 are covered by the molding part 200, when the light emitting devices 1 are arranged in a module, light reflection at the corners is blocked, which solves light scattering depending on a viewing angle.

Figure 20:
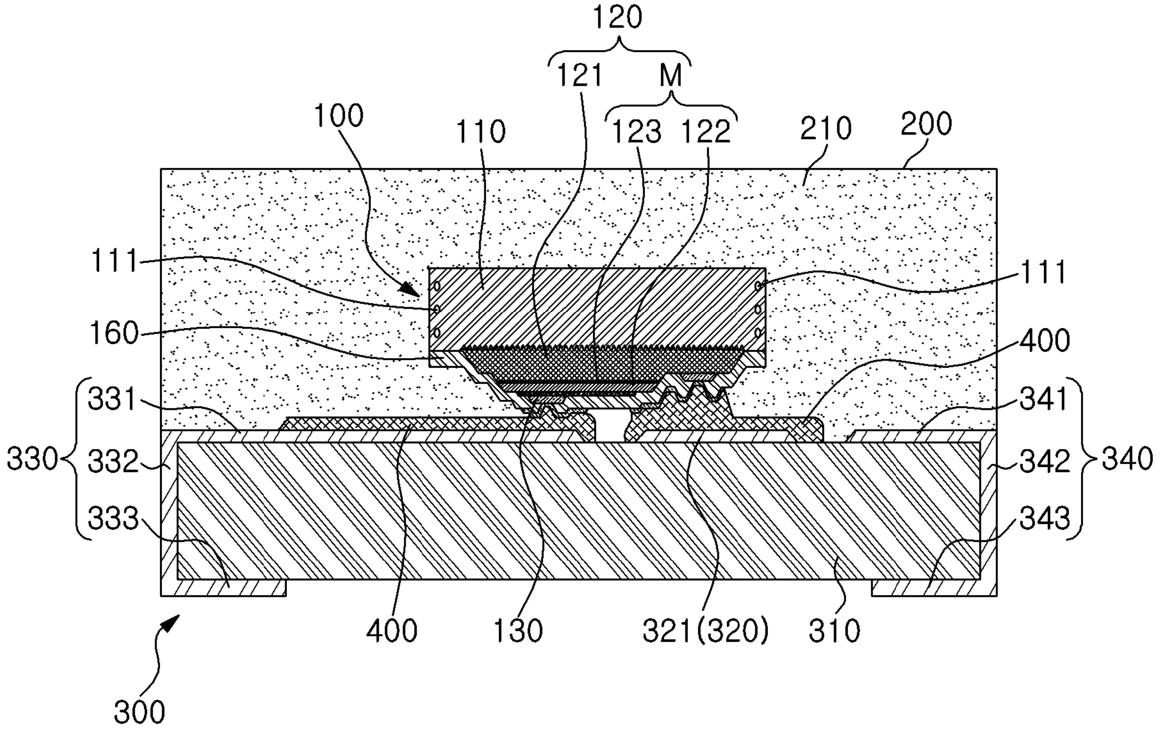
FIG. 20 is a longitudinal sectional view of a light emitting device according to a fourth exemplary embodiment.

Meanwhile, in addition to the above described configurations, according to a fourth exemplary embodiment, a substrate void 111 may be formed inside the light transmission part 110. Referring to FIG. 20, the substrate void 111 may refract light passing through the light transmission part 110. In this case, the beam angle of the light emitting structure 120 may be increased. In addition, the deviation of the beam angles of the first light emitting diode 101, the second light emitting diode 102, and the third light emitting diode 103 may be reduced by the substrate void 111 formed in the light transmission part 110. For example, the substrate void 111 may be provided at a side surface of the light transmission part 110, and may be provided in plural. In addition, the substrate voids 111 may be spaced apart from each other in the up-down direction along the side surface of the light transmission part 110.

Figure 21:
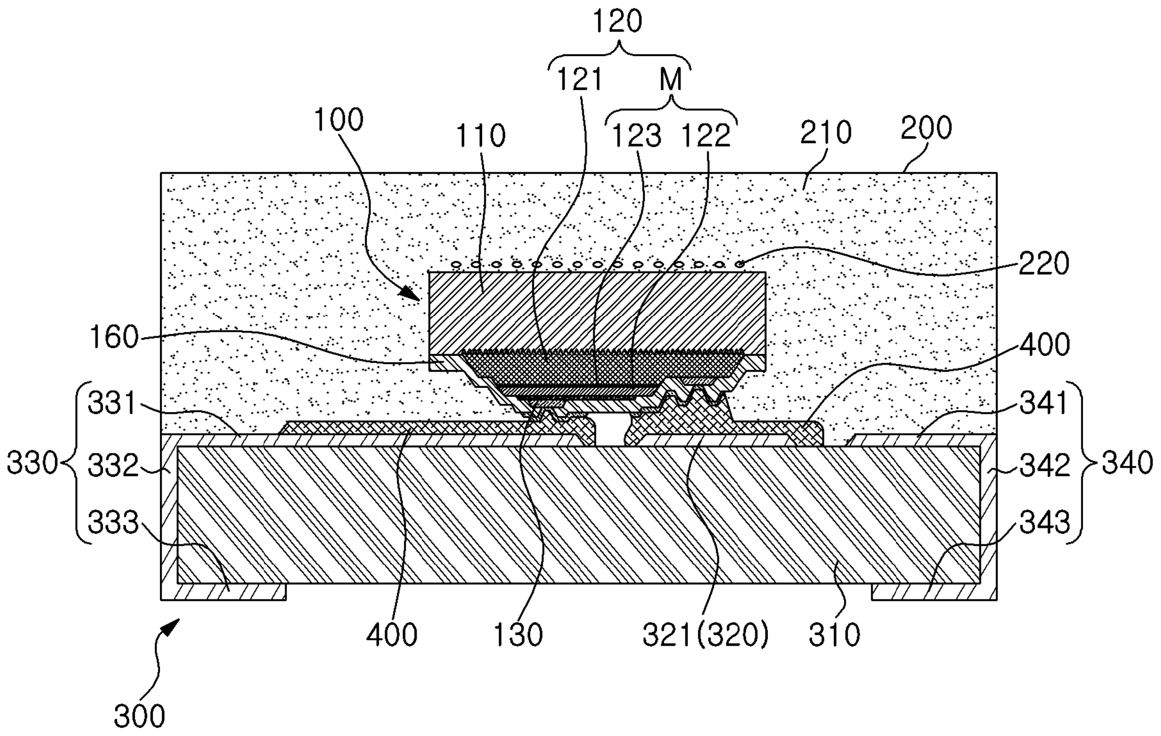
FIG. 21 is a longitudinal sectional view of a light emitting device according to a fifth exemplary embodiment.

Meanwhile, in addition to above described configurations, according to a fifth exemplary embodiment, a molding void 220 may be formed between the molding part 200 and the light emitting diode 100. Referring to FIG. 21, a plurality of molding voids 220 may be provided in a region where the upper surface of the light emitting diode 100 and the molding part 200 are in contact with each other. In addition, the plurality of molding voids 220 may refract light emitted from the light emitting diode 100. In this case, the beam angle of the light emitted from the light emitting diode 100 may be further increased.

Figure 22:
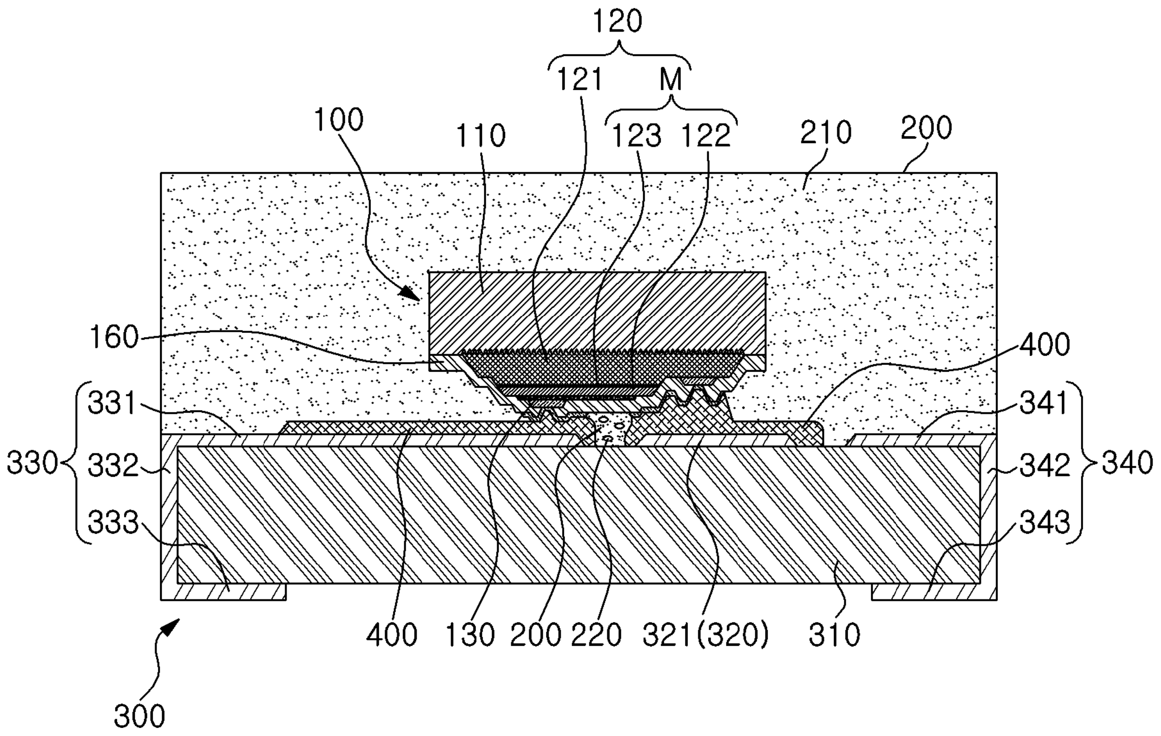
FIG. 22 is a longitudinal sectional view of a light emitting device according to a sixth exemplary embodiment.

Meanwhile, in addition to above described configurations, according to a sixth exemplary embodiment, the molding part 200 may be filled between the first terminal E1 and the second terminal E2. Referring to FIG. 22, the conductive material 400 connected to the first terminal E1 may be spaced apart from the conductive material 400 connected to the second terminal E2, and an empty space may be formed between the first terminal E1 and the second terminal E2. In this case, the molding part 200 may be filled in the empty space between the first terminal E1 and the second terminal E2.

In addition, a molding void 220 may be formed in the molding part 200 filled between the first terminal E1 and the second terminal E2. The molding void 220 may refract light emitted through the space between the first terminal E1 and the second terminal E2.

Figure 23:
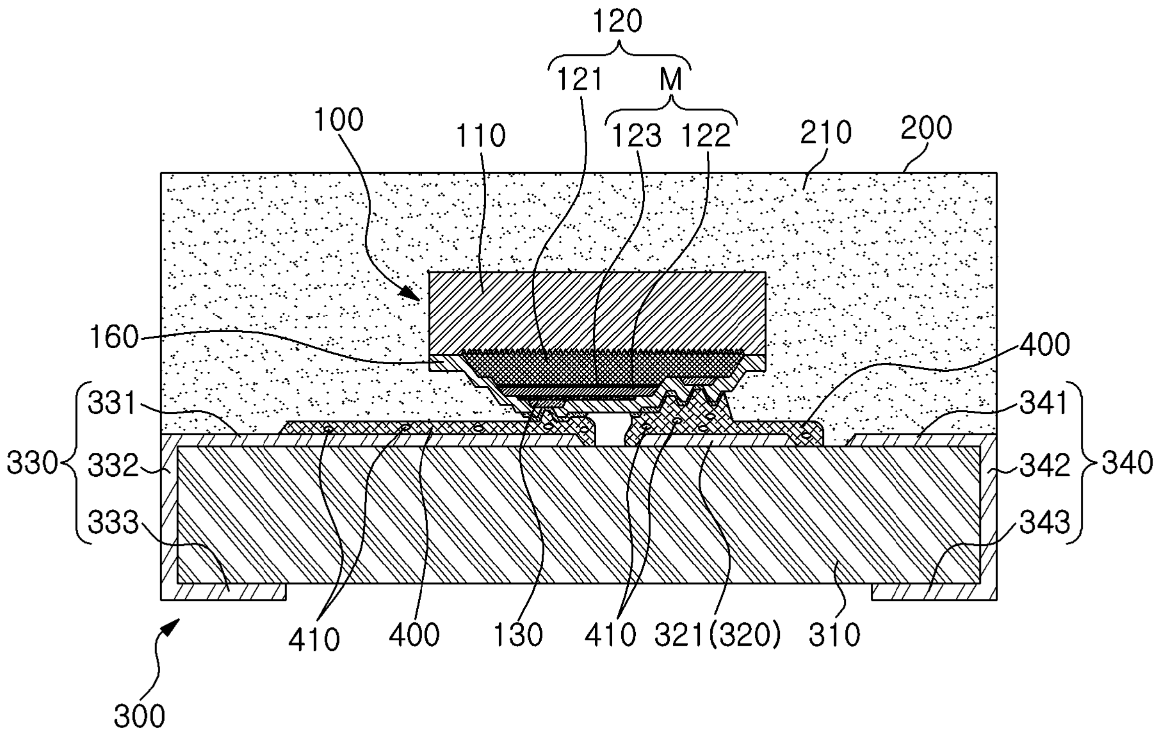
FIG. 23 is a longitudinal sectional view of a light emitting device according to a seventh exemplary embodiment.

Meanwhile, in addition to above described configurations, according to a seventh exemplary embodiment, conductive voids 410 may be formed in the conductive material 400. Referring to FIG. 23, the conductive voids 410 may be formed in the conductive material 400, and flux included in the conductive material 400 may easily be volatilized through the conductive voids 410 to the outside. In this case, defects occurring due to the flux remaining in the conductive material 400 can be reduced, and for example, it is possible to prevent the conductive material 400 from being spread due to the flux remaining in the conductive material 400.

Figure 24:
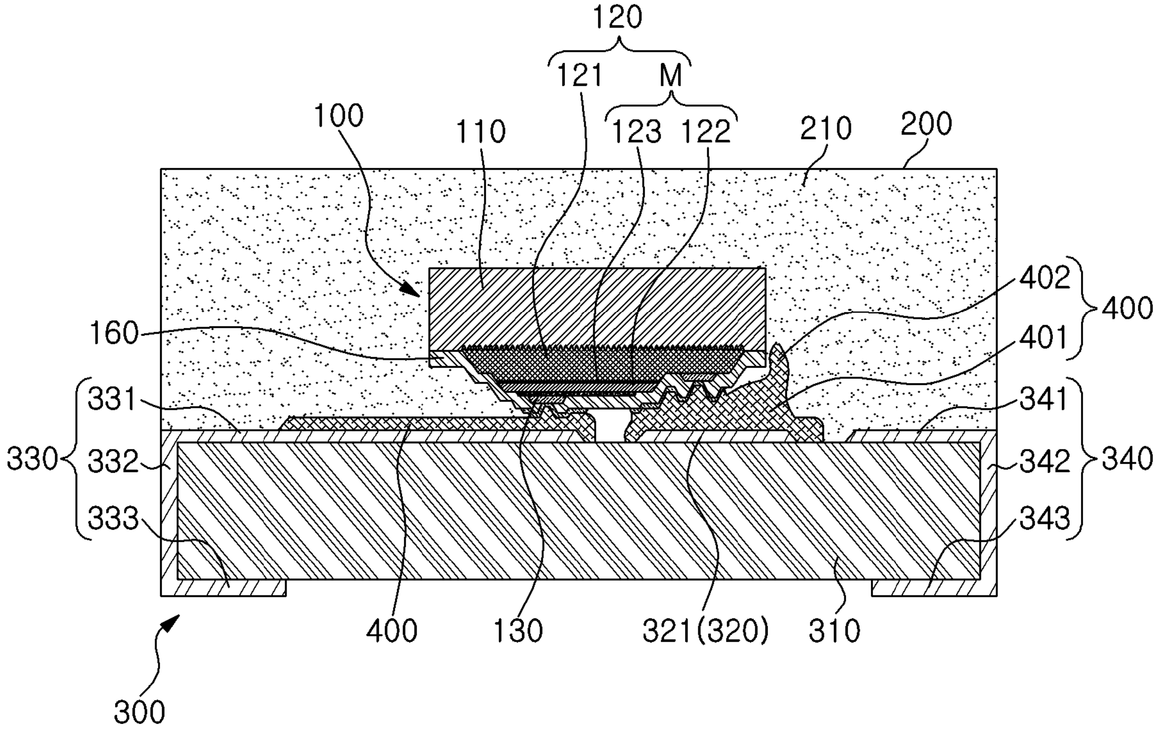
FIG. 24 is a longitudinal sectional view of a light emitting device according to an eighth exemplary embodiment.

Meanwhile, in addition to above described configurations, according to an eighth exemplary embodiment, the conductive material 400 may include a first conductive material portion 401 and a second conductive material portion 402. Referring to FIG. 24, the first conductive material portion 401 may fix the light emitting diode 100 with respect to the substrate 300. For example, the first conductive material portion 401 may electrically connect the substrate electrodes 320, 330, 340, and 350 to the bump electrode 150 of the light emitting diode 100. In addition, the first conductive material portion 401 may reflect light emitted downward from the light emitting diode 100.

The second conductive material portion 402 may extend upward from the first conductive material portion 401 and may reflect light emitted from the light emitting diode 100 laterally. For example, one end of the second conductive material portion 402 may be connected to the first conductive material portion 401, and the other end thereof may extend upward from the first conductive material portion 401 to face the side surface of the light emitting diode 100. In this case, the second conductive material portion 402 can reflect light emitted from the light emitting diode 100 to improve light efficiency.

Figure 25:
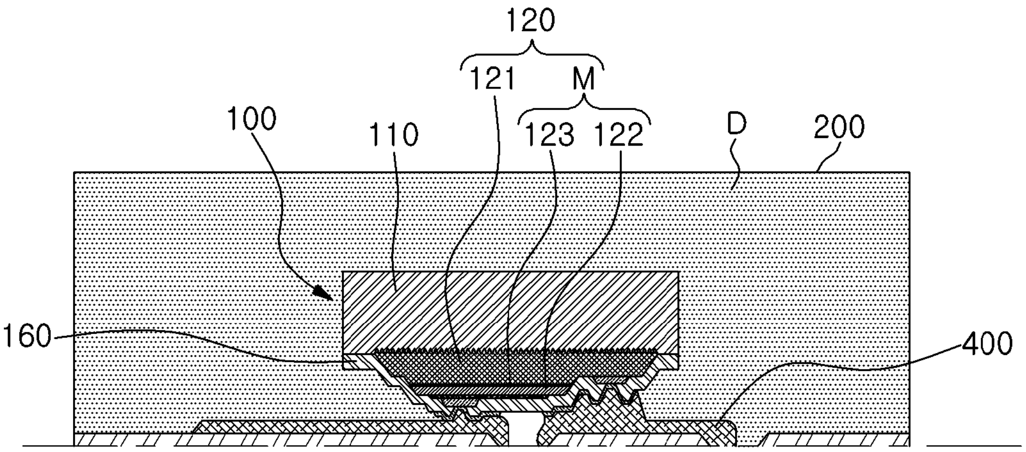
FIGS. 25 and 26 are longitudinal cross-sectional views of a light emitting device according to a ninth exemplary embodiment, which respectively show enlarged portions of a light emitting diode and a molding part.
Figure 26:
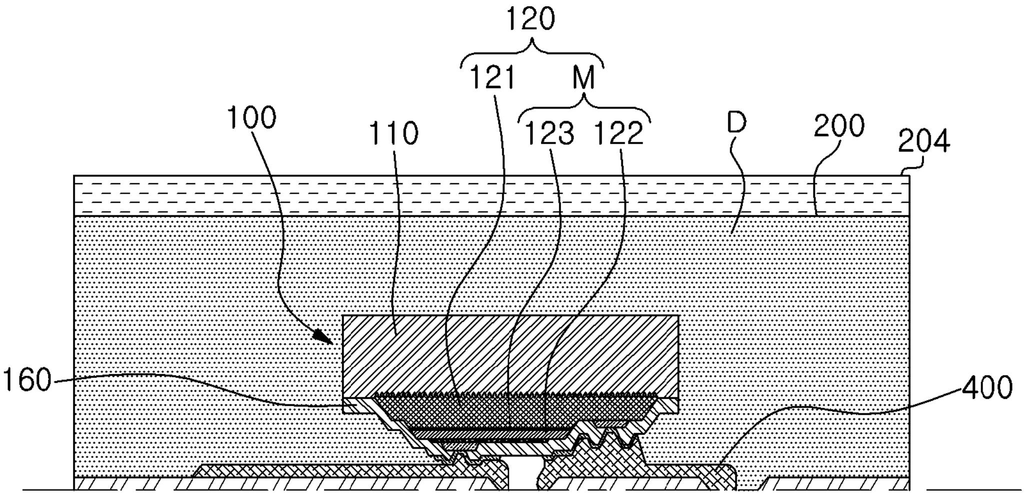
Figure 27:
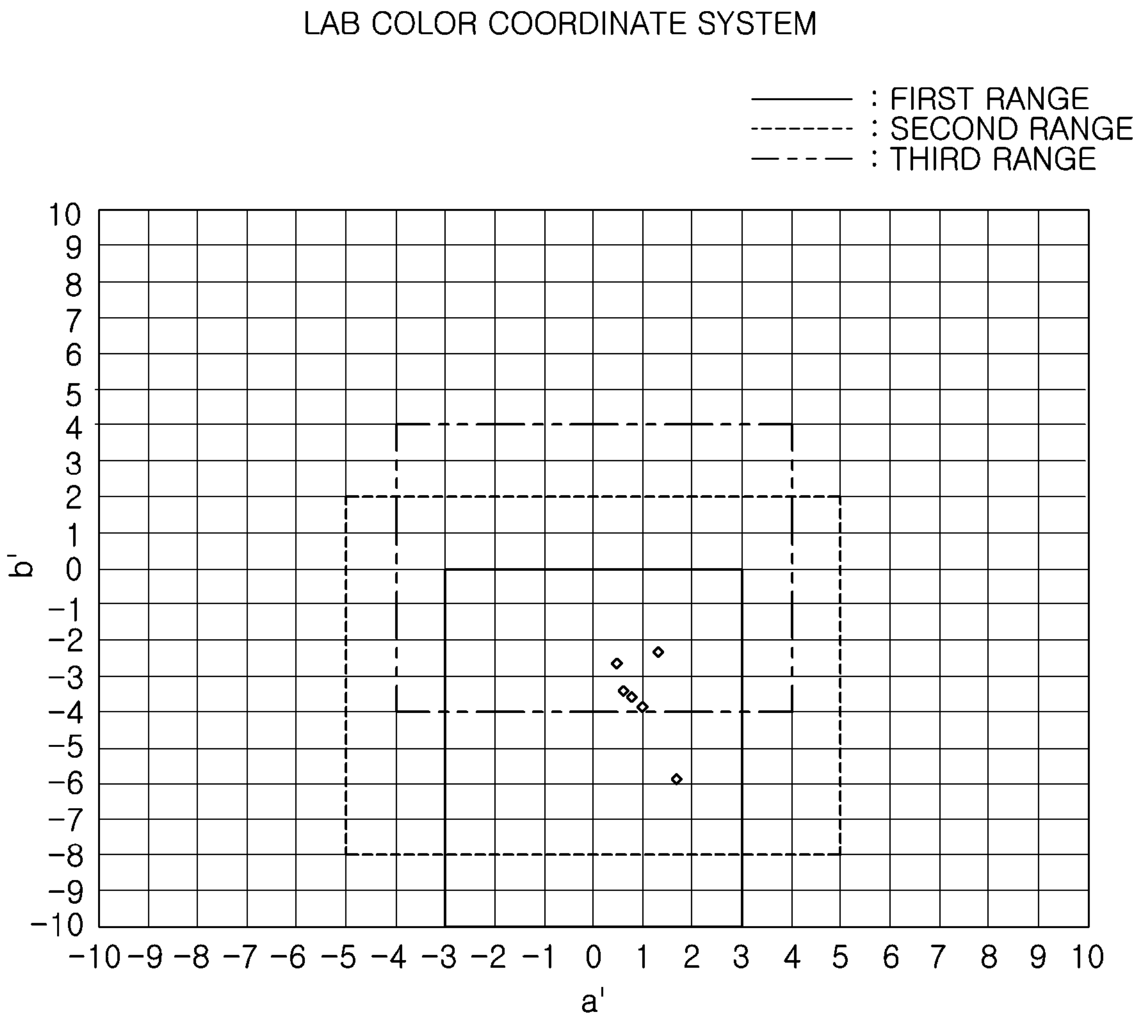
FIG. 27 is a diagram showing a coordinate range in a LAB color coordinate system that the molding part of a light emitting device according to the ninth exemplary embodiment.
Figure 28:
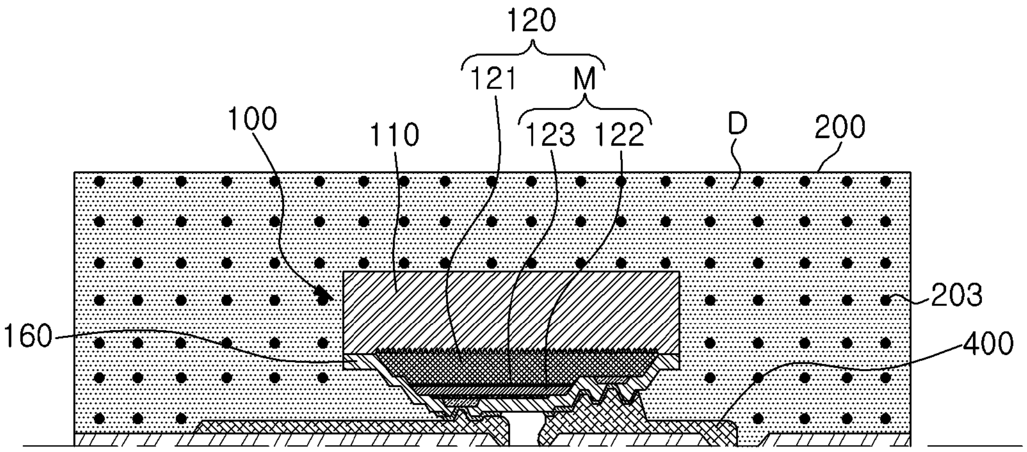
FIGS. 28 and 29 are longitudinal cross-sectional views of a light emitting device according to a tenth exemplary embodiment, which respectively showing enlarged portions of a light emitting diode and a molding part.

Meanwhile, in addition to above described configurations, referring to FIGS. 25 to 27, according to a ninth exemplary embodiment, the molding part 200 may include at least one of a plurality of different color pigments and a plurality of different color dyes. At least one of the plurality of different color pigments and the plurality of different color dyes may be mixed and included in the molding part 200. The color of the pigment or dye included in the molding part 200 may be white, yellow, green, black, magenta, blue, purple, etc.

Referring to FIG. 25, when at least one of the plurality of different color pigments and the plurality of different color dyes is mixed and included in the molding part 200, the molding part 200 may have various colors depending on the type of the pigment or dye D mixed in the molding part 200. For example, the molding part 200 may be black. In addition, the brightness or saturation of the color represented by the molding part 200 may be adjusted according to the color combination of the pigment or dye D included in the molding part 200. For example, when the molding part 200 is black, the brightness and saturation of the black color may be adjusted. More particularly, the black color represented by the molding part 200 may become darker or less dark. In addition, the transparency of the molding part 200 may be adjusted according to the concentration of the pigment or dye D mixed in the molding part 200. For example, the molding part 200 may be a colored molding having a transparency of 20% or more. Accordingly, the molding part 200 may implement a color suitable for the user's emotion. In addition, the molding part 200 including the pigment or dye D can implement a uniform color expression of the display apparatus by improving the color difference of the light emitted from the plurality of light emitting devices 1.

Referring to FIG. 27, the color represented by the molding part 200 in which at least one kind of dye or pigment is mixed may satisfy one of the following three ranges in the LAB color coordinate system.

First range: $-3 \le a' \le 3$, $-10 \le b' \le 0$

Second range: $-5 \le a' \le 5$, $-8 \le b' \le 2$

Third range: $-4 \le a' \le 4$, $-4 \le b' \le 4$

When the color represented by the molding part 200 satisfies any one of the first to third ranges, a display apparatus including a plurality of light emitting modules in which a plurality of light emitting devices 1 are arrayed can clearly implement various colors. Further, color interference between adjacent light emitting devices 1 can be minimized. In addition, discoloration of the molding part 200 by incident light from the outside of the light emitting device 1 or heat generated from the inside or outside of the light emitting device 1 can be minimized. Even when the molding part 200 is discolored, color change of the molding part 200 may be minimized. In addition, when the plurality of light emitting devices 1 are arrayed, generation of dark and bright lines can be minimized.

The molding part 200 may further include a polymer resin and a curing initiator as well as the aforementioned pigment or dye. The polymer resin may include one or more of silicone, epoxy, and acrylate. In addition, the curing initiator may be a thermal curing initiator or an ultraviolet curing initiator. Further, the molding part 200 may further include a binder.

Referring to FIG. 26, an upper molding 204 may be disposed on an upper surface of the molding part 200. The upper molding 204 may be a molding or a film. In a case where the upper molding 204 is a film, the film may include one or more of a pressure sensitive adhesive (PSA) layer, a polyethylene terephthalate (PET) or polyimide layer, an anti-glare layer, and a low-reflection layer. The pressure sensitive adhesive layer, and the polyethylene terephthalate or polyimide layer may include one or more of black pigment and dye. In addition, the film may further include a polarizing layer. The upper molding 204 may be formed of a plurality of layers. At least one of the plurality of layers of the upper molding 204 may be a glare prevention layer, that is, an anti-glare layer. Further, at least one of the plurality of layers of the upper molding 204 may be a transparent layer. In addition, at least one surface of the upper molding 204 may have a roughness.

Meanwhile, in addition to above described configurations, referring to FIGS. 28 to 31, according to a tenth exemplary embodiment, the molding part 200 may further include a diffusion agent 203. The diffusing agent may include one or more of PMMA (polymethylmethacrylate), silica ($SiO_2$, silicon dioxide), and zirconium dioxide. The molding part 200 may further include one or more pigments or dyes D.

Figure 30:
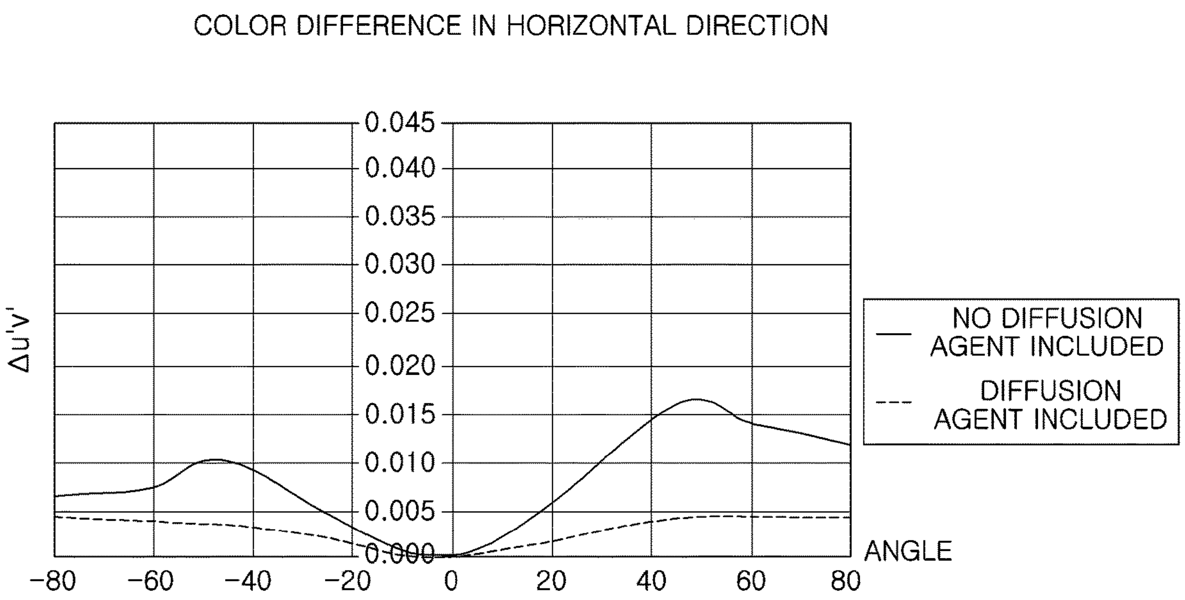
FIG. 30 is a graph showing a color difference $\Delta u'v'$ depending on a viewing angle of a molding part when a diffusion agent is included in the molding part of the light emitting device and when no diffusion agent is included.
Figure 30:
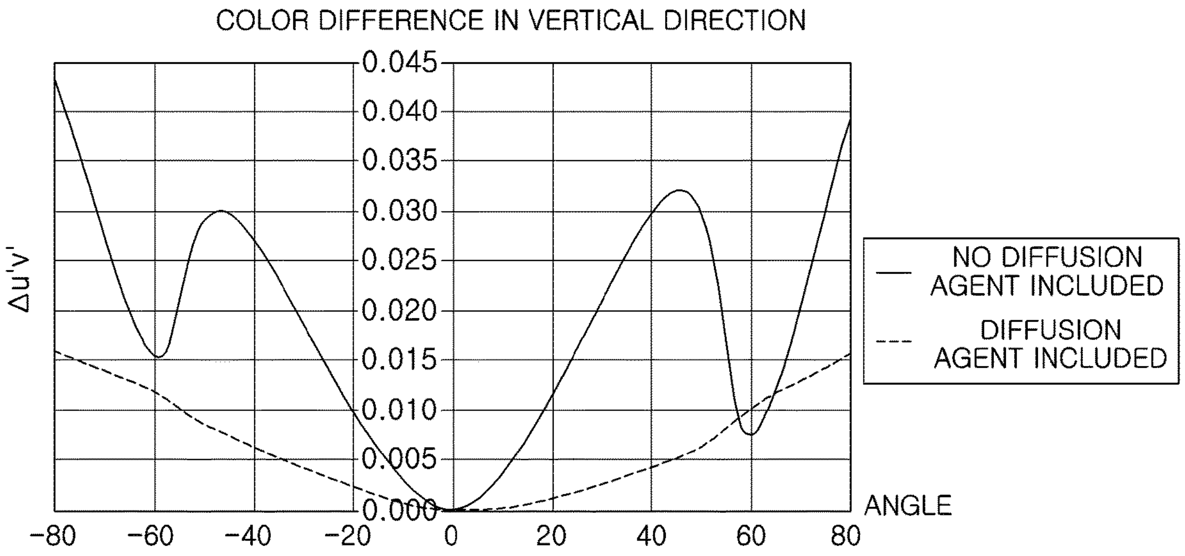
Figure 31:
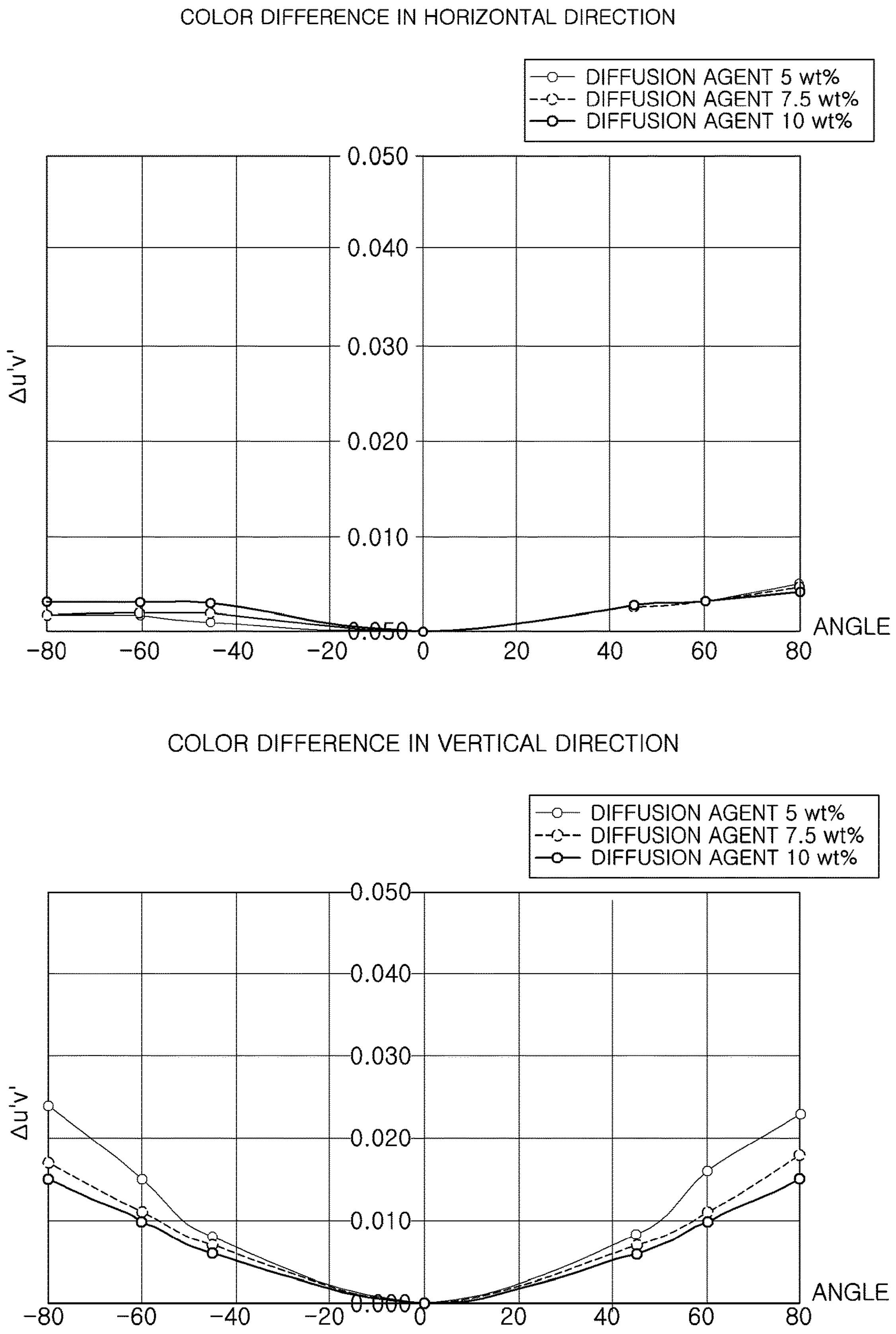
FIG. 31 is a graph showing the color difference $\Delta u'v'$ according to the viewing angle depending on the amount of the diffusing agent included in the molding part of the light emitting device according to the tenth exemplary embodiment.

The horizontal direction and the vertical direction described in FIGS. 30 and 31 may be defined as follows. The vertical direction may be defined as a direction in which the first light emitting diode 101 for emitting red light, the second light emitting diode 102 for emitting green light, and the third light emitting diode 103 for emitting blue light are arranged, and the horizontal direction may be defined as a direction perpendicular to the vertical direction. In FIGS. 30 and 31, the color difference Δu'v' in the horizontal direction is a value obtained by measuring a color difference Δu'v' of the molding part 200 when the viewing angle is changed from viewing the front side to one side in the horizontal direction or the other side in the horizontal direction. In addition, in FIGS. 30 and 31, the vertical color difference Δu'v' is a value obtained by measuring a color difference Δu'v' of the molding part 200 when the viewing angle is changed from viewing the from side to one side in the vertical direction or the other side in the vertical direction.

The color difference Δu'v' according to the viewing angle is obtained by applying the following formula based on the CIE1976 chromaticity diagram. In the following formula, x, y are the coordinate (x, y) values of the CIE1931 color coordinate system. With the result measured by the following formula, the color change rate Δu'v' can be measured with reference to a viewing angle of 0 degrees.

$$u' = \frac{4x}{-2x + 12y + 3}$$

$$v' = \frac{9y}{-2x + 12y + 3}$$

Referring to FIG. 30, it can be seen that when the molding part 200 includes the diffusing agent, the color difference Δu'v' according to the viewing angle of the molding part 200 is improved. In particular, when the diffusing agent is included in the molding part 200, as compared to a case where the diffusion agent is not included, the color difference Δu'v' according to the viewing angle of the molding part 200 has been reduced when the viewing angle is changed from the front side to one side or the other side in the horizontal direction. In addition, when the diffusion agent is included in the molding part 200, as compared to when the diffusion agent is not included, the color difference Δu'v' according to the viewing angle of the molding part 200 has been reduced when the viewing angle is changed from the front side to one side or the other side in the vertical direction.

The color difference Δu'v' of the molding part 200 may be 0.01 or less when viewed at 45 degrees from one side or the other side, in both the horizontal and vertical directions, with respect to when viewed from the front side. In addition, the color difference Δu'v' of the molding part 200 may be 0.03 or less when viewed at 80 degrees from one side or the other side, in both the horizontal and vertical directions, with respect to when viewed from the front side. In addition, the color difference Δu'v' according to the viewing angle of the molding part 200 may be 0.005 or less between one side and the other side, in both the horizontal and vertical directions, with respect to when viewed from the front side. The graph of the molding part 200 forms a waveform close to a linear shape in a range of −80 degrees to +80 degrees, and the average color difference Δu'v' in a range of adjacent angle ranges may be formed to be 0.003 or less. In addition, in the graph of the color difference Δu'v' according to the viewing angle of the molding part 200, the height difference between the waveforms of adjacent ranges in the range of −80 degrees and +80 degrees may be 0.005 or less, and a peak of the waveforms of adjacent ranges may be 0.003 or less. When these conditions are satisfied, the viewing angle can be relatively uniform. In addition, light loss can be reduced, and light extraction efficiency can be improved. Further, even when the user views at any angle, the user can perceive substantially the same color.

The molding part 200 may further include a matting agent. The matting agent mixed in the molding part 200 may form irregularities on the surface of the molding part 200. The position of the matting agent particles added in the molding part 200 may be different from that of the diffusion agent 203. In this case, the matting agent may be located on the upper surface of the molding part 200 to form irregularities on the upper surface of the molding part 200, and the diffusion agent 203 may be located close to the light emitting diode. The matting agent may be materials such as silica, wax, and filler. The irregularities formed on the surface of the molding part 200 by the matting agent can improve the light extraction efficiency of the light emitting device 1, and when a plurality of light emitting devices 1 are arrayed, generation of dark or bright lines can be minimized. In addition, by lowering the reflectivity of the surface of the display apparatus by external light, glare of the user can be prevented.

The diffusion agent may be included in the molding part 200 in an amount of 5 wt % to 20 wt % of the molding part 200. If the diffusion agent is included in the molding part 200 less than 5 wt % of the molding part 200, color difference may not be improved. In addition, if the diffusion agent is included in the molding part 200 larger than 20 wt % of the molding part 200, the molding part 200 becomes cloudy and affects the color of the molding part 200, so that the molding part 200 may not display the color properly. For example, when the molding part 200 is black, the visibility of the display apparatus may deteriorate because the molding part 200 does not properly display black color.

Referring to FIG. 31, within the range of 5 wt % to 20 wt % of the molding part 200, the more the diffusing agent is included in the molding part 200, the color difference Δu'v' according to the viewing angle of the molding part 200 may be reduced. The color difference Δu'v' of the molding part 200 may be 0.01 or less when viewed at 45 degrees from one side or the other side, in both the horizontal and vertical directions, with respect to when viewed from the front side.

In addition, the color difference Δu'v' of the molding part 200 may be 0.03 or less when viewed at 80 degrees from one side or the other side, in both the horizontal and vertical directions, with respect to when viewed from the front side. In addition, the color difference Δu'v' according to the viewing angle of the molding part 200 may be 0.005 or less between one side and the other side, in both the horizontal and vertical directions, with respect to when viewed from the front side. The graph of the color difference Δu'v' according to the viewing angle of the molding part 200 forms a waveform close to a linear shape in the range between −80 degrees and +80 degrees, and the average color difference in adjacent angle ranges may be formed to be 0.003 or less. In addition, in the graph of the color difference Δu'v' according to the viewing angle of the molding part 200, the height difference between the waveforms of adjacent ranges in the range of −80 degrees and +80 degrees may be 0.005 or less, and a peak of the waveforms of adjacent ranges may be 0.003 or less. When these conditions are satisfied, the viewing angle can be relatively uniform. In addition, light loss can be reduced, and light extraction efficiency can be improved. Further, even when the user views at any angle, the user can perceive substantially the same color.

The molding part 200 may further include a polymer resin and a curing initiator as well as the above-described pigment or dye and diffusion agent. The polymer resin may include one or more of silicone, epoxy, and acrylate. In addition, the curing initiator may be a thermal curing initiator or an ultraviolet curing initiator. Further, the molding part 200 may further include a binder.

Figure 29:
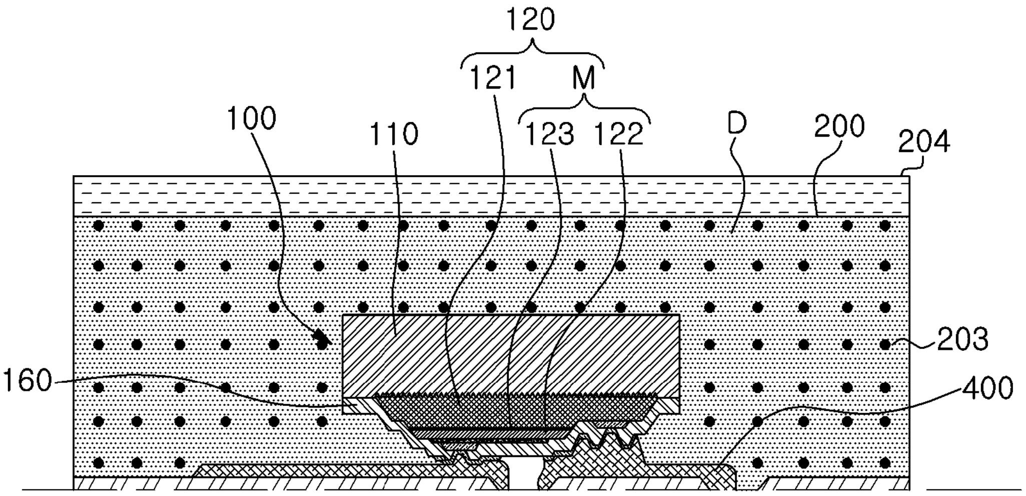

Referring to FIG. 29, an upper molding 204 may be disposed on an upper surface of the molding part 200. The upper molding 204 may be a molding or a film. In a case where the upper molding 204 is a film, the film may include one or more of a pressure sensitive adhesive (PSA) layer, a polyethylene terephthalate (PET) or polyimide layer, an anti-glare layer, and a low-reflection layer. The pressure sensitive adhesive layer, and the polyethylene terephthalate or polyimide layer may include one or more of black pigment and dye. In addition, the film may further include a polarizing layer. The upper molding 204 may be formed of a plurality of layers. At least one of the plurality of layers of the upper molding 204 may be a glare prevention layer, that is, an anti-glare layer. Further, at least one of the plurality of layers of the upper molding 204 may be a transparent layer. In addition, at least one surface of the upper molding 204 may have a roughness.

Figure 33:
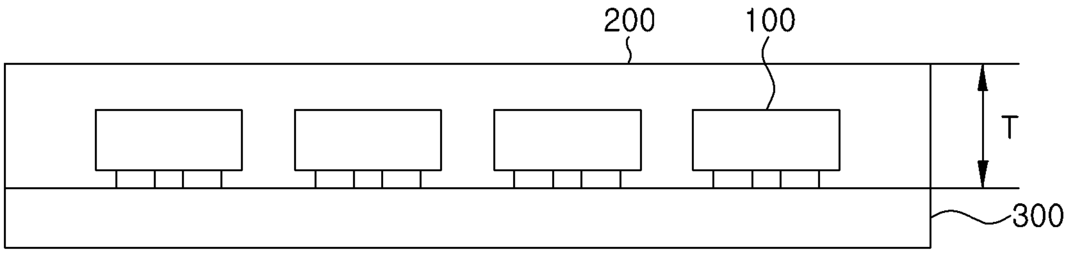
FIG. 33 is a view showing the thickness of a molding part of a light emitting device according to an eleventh exemplary embodiment.

Meanwhile, in addition to above described configurations, according to an eleventh exemplary embodiment, when the molding part 200 includes at least one of a pigment, a dye, and a diffusion agent, a thickness of the molding part 200 may be twice or more and 3 times or less the thickness of the light emitting diode 100. In addition, a pitch may be twice or more and 4 times or less the thickness of the molding part 200. As used herein, a pitch refers to a distance between the centers of adjacent light emitting devices 1, and the thickness T of the molding part 200 refers to a distance from the substrate 300 to the upper surface of the molding part 200, as shown in FIG. 33.

If these conditions are satisfied, a display apparatus including a plurality of light emitting modules in which the plurality of light emitting devices 1 are arrayed can have uniform color variations of all colors. In addition, since the amount of overlapping light between the light emitting modules is reduced, no dark line or bright line can occur at the boundary of the light emitting modules.

Figure 32:
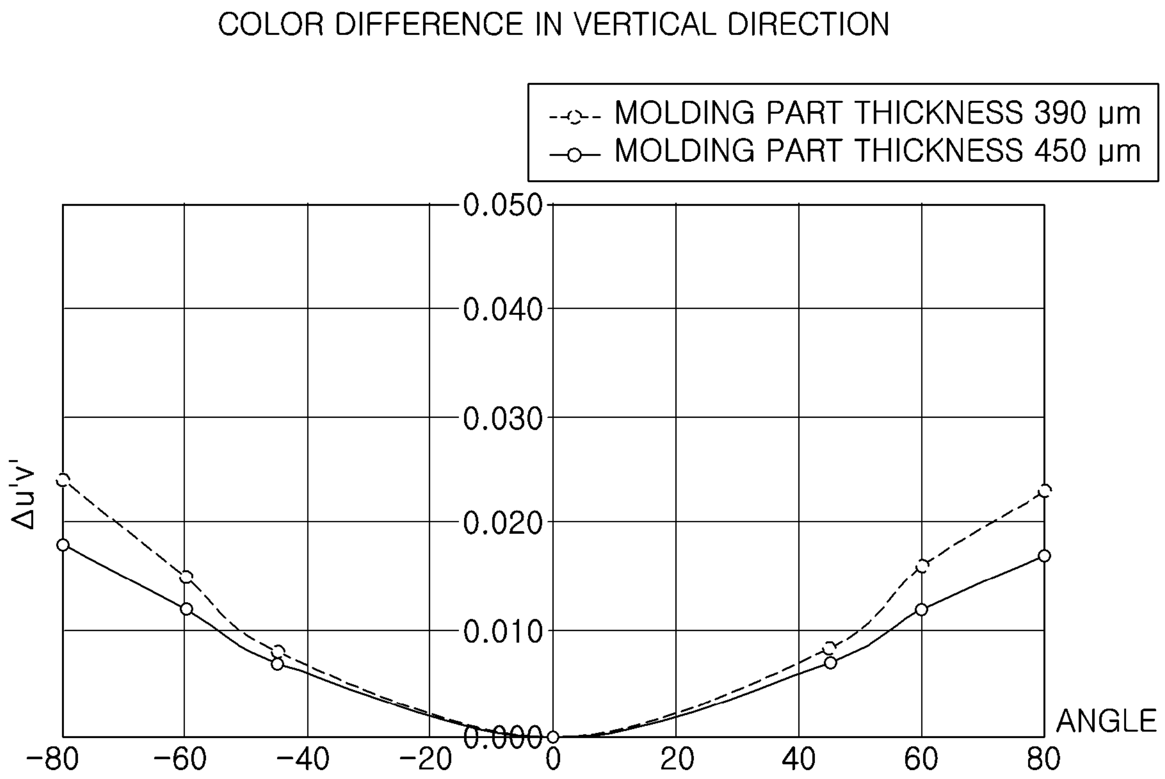
FIG. 32 is a diagram illustrating color difference $\Delta u'v$ according to the viewing angle depending on to a thickness of a molding part of a light emitting device according to an eleventh exemplary embodiment.

Referring to FIG. 32, when the diffusion agent is included in the molding part 200 at 7 wt % of the molding part 200, the color difference Δu'v' according to the viewing angle is reduced as the thickness of the molding part 200 increases. For example, when the thickness of the molding part is 400 μm or more and 500 μm or less than when the thickness is 350 μm or more and 400 μm or less, the color difference Δu'v' according to the viewing angle may be more alleviated. In other words, even when the molding part 200 contains a relatively low concentration of the diffusing agent, by increasing the thickness of the molding part 200, the color difference Δu'v' according to the viewing angle can be reduced.

As described above, by adjusting the characteristics of the molding part 200, the inventive concepts can be applied to various types of display apparatus. For example, in the case of a signage display apparatus installed on an outer wall, the inventive concepts can be implemented so that the color difference Δu'v' becomes 0.01 or less when viewed from one side or the other side at 45 degrees. In addition, in the case of an indoor display apparatus, the inventive concepts can be implemented so that the color difference Δu'v' becomes 0.01 or less when viewed from one side or the other side at 80 degrees.

Exemplary embodiments of the present disclosure have an effect of precisely emitting red light, green light, and blue light at a desired luminance ratio.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting device, comprising:

a plurality of light emitting diodes configured to emit light;

a substrate electrically connected to the plurality of light emitting diodes; and a molding covering at least one surface of the plurality of light emitting diodes, wherein the plurality of light emitting diodes includes a first light emitting diode configured to emit red light, a second light emitting diode configured to emit green light, and a third light emitting diode configured to emit blue light, wherein the molding includes one or more of a plurality of different color pigments and a plurality of different color dyes, and wherein the molding includes an upper molding and a lower molding, and the lower molding is a black molding.

2. The light emitting device of claim 1, wherein the molding satisfies one of the following three ranges in a LAB color coordinate system, first range: $-3 \le a' \le 3$, $-10 \le b' \le 0$;

second range: $-5 \le a' \le 5$, $-8 \le b' \le 2$; and third range: $-4 \le a' \le 4$, $-4 \le b' \le 4$.

3. The light emitting device of claim 1, wherein the molding further includes a polymer resin and a curing initiator.

4. The light emitting device of claim 1, wherein the upper molding includes a plurality of layers, and at least one of the plurality of layers is a transparent layer.

5. The light emitting device of claim 1, wherein the molding further includes a diffusion agent.

6. The light emitting device of claim 5, wherein light emitted from at least one of the plurality of light emitting diodes and transmitted through the molding has a color difference of 0.01 or less when viewed at an angle of 45 degrees from one side of the light emitting device, in a horizontal or a vertical direction, with respect to when viewed from a front side of the light emitting device.

7. The light emitting device of claim 5, wherein light emitted from at least one of the plurality of light emitting diodes and transmitted through the molding has a color difference of 0.03 or less when viewed at an angle of 80 degrees from one side of the light emitting device, in a horizontal or a vertical direction, with respect to when viewed from a front side of the light emitting device.

8. The light emitting device of claim 5, wherein light emitted from at least one of the plurality of light emitting diodes and transmitted through the molding has an average color difference of 0.003 or less in a range of adjacent angle ranges and a height difference of 0.005 or less between waveforms of adjacent ranges in a range of −80 degrees to +80 degrees, in a horizontal or a vertical direction, with respect to when viewed from a front side of the light emitting device.

9. A light emitting device, comprising:
- a plurality of light emitting diodes configured to emit light;
- a substrate electrically connected to the plurality of light emitting diodes; and
- a molding covering at least one surface of the plurality of light emitting diodes,
- wherein the plurality of light emitting diodes includes a first light emitting diode configured to emit red light, a second light emitting diode configured to emit green light, and a third light emitting diode configured to emit blue light,
- wherein the molding includes at least one diffusion agent,
- wherein the molding includes one or more of a plurality of different color pigments and a plurality of different color dyes, and
- wherein the molding includes an upper molding and a lower molding, and the lower molding is a black molding.

10. The light emitting device of claim 9, wherein light emitted from at least one of the plurality of light emitting diodes and transmitted through the molding has a color difference of 0.01 or less when viewed at an angle of 45 degrees from one side of the light emitting device, in a horizontal or a vertical direction, with respect to when viewed from a front side of the light emitting device.

11. The light emitting device of claim 9, wherein light emitted from at least one of the plurality of light emitting diodes and transmitted through the molding has a color difference of 0.03 or less when viewed at an angle of 80 degrees from one side of the light emitting device, in a horizontal or a vertical direction, with respect to when viewed from a front side of the light emitting device.

12. The light emitting device of claim 9, wherein light emitted from at least one of the plurality of light emitting diodes and transmitted through the molding has an average color difference of 0.003 or less in a range of adjacent angle ranges and a height difference of 0.005 or less between waveforms of adjacent ranges in a range of −80 degrees to +80 degrees, in a horizontal or a vertical direction, with respect to when viewed from a front side of the light emitting device.

13. The light emitting device of claim 9, wherein the diffusion agent is included in a molding part in an amount of 5 wt % to 20 wt % of the molding.

14. The light emitting device of claim 9, wherein a thickness of the molding is in a range of 2 times to 3 times a thickness of the light emitting diode.

15. The light emitting device of claim 9,
- wherein the molding satisfies one of the following three ranges in a LAB color coordinate system,
- first range: $-3 \leq a' \leq 3$, $-10 \leq b' \leq 0$;
- second range: $-5 \leq a' \leq 5$, $-8 \leq b' \leq 2$; and
- third range: $-4 \leq a' \leq 4$, $-4 \leq b' \leq 4$.

16. A display apparatus, comprising:
- a plurality of light emitting diodes configured to emit light;
- a substrate electrically connected to the plurality of light emitting diodes; and
- a molding covering at least one surface of the plurality of light emitting diodes,
- wherein the plurality of light emitting diodes includes a first light emitting diode configured to emit red light, a second light emitting diode configured to emit green light, and a third light emitting diode configured to emit blue light,
- wherein the molding includes one or more of a plurality of different color pigments and a plurality of different color dyes, and
- wherein the molding includes an upper molding and a lower molding, and the lower molding is a black molding.

17. The display apparatus of claim 16, wherein the molding satisfies one of the following three ranges in a LAB color coordinate system,
- first range: $-3 \leq a' \leq 3$, $-10 \leq b' \leq 0$;
- second range: $-5 \leq a' \leq 5$, $-8 \leq b' \leq 2$; and
- third range: $-4 \leq a' \leq 4$, $-4 \leq b' \leq 4$.

18. The display apparatus of claim 16, wherein the molding further includes a diffusion agent.

19. The display apparatus of claim 18, wherein light emitted from at least one of the plurality of light emitting diodes and transmitted through the molding has a color difference of 0.03 or less when viewed at an angle of 80 degrees from one side of the display apparatus, in a horizontal or a vertical direction, with respect to when viewed from a front side of the display apparatus.

* * * * *